(12) United States Patent
Fischer et al.

(10) Patent No.: US 9,609,730 B2
(45) Date of Patent: Mar. 28, 2017

(54) ADJUSTMENT OF VUV EMISSION OF A PLASMA VIA COLLISIONAL RESONANT ENERGY TRANSFER TO AN ENERGY ABSORBER GAS

(71) Applicant: Lam Research Corporation, Fremont, CA (US)

(72) Inventors: Andreas Fischer, Castro Valley, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 17 days.

(21) Appl. No.: 14/539,121

(22) Filed: Nov. 12, 2014

(65) Prior Publication Data

US 2016/0135274 A1     May 12, 2016

(51) Int. Cl.
| | | |
|---|---|---|
| *H01L 21/00* | (2006.01) | |
| *H05G 2/00* | (2006.01) | |
| *H01L 21/3065* | (2006.01) | |
| *H01J 37/32* | (2006.01) | |
| *H01L 21/66* | (2006.01) | |

(52) U.S. Cl.
CPC ....... *H05G 2/003* (2013.01); *H01J 37/32082* (2013.01); *H01L 21/3065* (2013.01); *H01L 22/12* (2013.01); *H01L 22/26* (2013.01); *H01L 22/20* (2013.01)

(58) Field of Classification Search
CPC ..... H01L 21/3065; H01L 22/20; H01L 22/12; H01L 22/26; H05G 2/003; H01J 37/32082
USPC .......... 216/60, 63, 67; 438/9, 677, 706, 710, 438/758, 669, 694; 250/492.2, 504 R
See application file for complete search history.

(56) References Cited

U.S. PATENT DOCUMENTS

| | | | |
|---|---|---|---|
| 5,948,704 A | 9/1999 | Benjamin et al. | |
| 6,461,529 B1 * | 10/2002 | Boyd ............... | H01L 21/31116 216/67 |
| 7,160,671 B2 * | 1/2007 | Ko ............................ | G03F 7/40 430/313 |
| 7,517,814 B2 * | 4/2009 | Wajda ...................... | C23C 8/28 257/E21.268 |
| 7,732,728 B2 | 6/2010 | Dhindsa et al. | |
| 7,740,736 B2 | 6/2010 | Fischer et al. | |
| 8,552,334 B2 | 10/2013 | Tappan et al. | |
| 9,362,133 B2 | 6/2016 | Shamma et al. | |

(Continued)

*Primary Examiner* — Nadine Norton
*Assistant Examiner* — Christopher Remavege
(74) *Attorney, Agent, or Firm* — Weaver Austin Villeneuve & Sampson LLP

(57) ABSTRACT

Disclosed are methods of adjusting the emission of vacuum ultraviolet (VUV) radiation from a plasma in a semiconductor processing chamber. The methods may include generating a plasma in the processing chamber which includes a VUV-emitter gas and a collisional energy absorber gas, and adjusting the emission of VUV radiation from the plasma by altering the concentration ratio of the VUV-emitter gas to collisional energy absorber gas in the plasma. In some embodiments, the VUV-emitter gas may be helium and the collisional energy absorber gas may be neon, and in certain such embodiments, adjusting VUV emission may include flowing helium and/or neon into the processing chamber in a proportion so as to alter the concentration ratio of helium to neon in the plasma. Also disclosed are apparatuses which implement the foregoing methods.

19 Claims, 10 Drawing Sheets

(56) References Cited

U.S. PATENT DOCUMENTS

| | | | |
|---|---|---|---|
| 2011/0139748 A1* | 6/2011 | Donnelly | H01J 37/32036 |
| | | | 216/37 |
| 2012/0095586 A1* | 4/2012 | Chen | H01J 37/32926 |
| | | | 700/110 |
| 2013/0023125 A1* | 1/2013 | Singh | H01L 21/3065 |
| | | | 438/706 |

\* cited by examiner

ADJUSTMENT OF VUV EMISSION OF A PLASMA VIA COLLISIONAL RESONANT ENERGY TRANSFER TO AN ENERGY ABSORBER GAS

BACKGROUND

As device and features size continue to shrink in the semiconductor industry, and also as 3D device structures (e.g., Intel's Tri-Gate transistor architecture) become more prevalent in integrated circuit (IC) design, the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying device structure. Likewise, atomic layer etch (ALE) is an adsorption-mediated etch technique analogous to ALD which, because it involves the reacting of an adsorption-limited layer of etchant, may be used to controllably and selectively etch silicon substrates with a high level of precision, although, like ALD, multiple "ALE cycles" are typically required to accomplish the desired amount of substrate etching. Because both ALD and ALE are oftentimes plasma-activated processes, controlling the characteristics of the plasma—used to activate the film-forming reaction in ALD or the etch reaction in ALE—over the course of many cycles may be of considerable importance.

SUMMARY

Disclosed herein are methods of adjusting the emission of vacuum ultraviolet (VUV) radiation from a plasma in a semiconductor processing chamber. The methods may include generating a plasma in the processing chamber, the plasma comprising a VUV-emitter gas and a collisional energy absorber gas, and adjusting the emission of VUV radiation from the plasma by altering the concentration ratio of the VUV-emitter gas to collisional energy absorber gas in the plasma. In some embodiments, the VUV-emitter gas is helium and, in some embodiments, the collisional energy absorber gas is neon. In some embodiments, adjusting the emission of VUV radiation from the plasma may include flowing helium and/or neon into the processing chamber in a proportion so as to alter the concentration ratio of helium to neon in the plasma. In some embodiments, the methods may further include measuring a property of the plasma and/or the substrate and setting the flow of helium and/or neon into the processing chamber in response to the measured property. In certain embodiments, the measured property may be the emission intensity from an emission band of an excited state species of the plasma. In certain embodiments, the measured property may be a profile of an etched feature of a semiconductor substrate measured with a metrology tool, the feature having been etched in the processing chamber. In some embodiments, the plasma whose VUV emission is adjusted is a capacitively coupled plasma.

Also disclosed herein are semiconductor processing apparatuses within which a VUV-emitting plasma is generated and its VUV emission adjusted. The apparatuses may include a processing chamber, a plasma generator, one or more gas flow inlets configured for flowing helium and neon into the processing chamber, and a controller for controlling the operation of the apparatus. In some embodiments, the controller may include machine readable instructions for operating the plasma generator to generate a VUV emitting plasma in the processing chamber, the plasma including helium and neon, and operating the one or more gas flow inlets to adjust the emission of VUV radiation from the plasma by flowing helium and/or neon into the processing chamber in a proportion so as to alter the concentration ratio of helium to neon in the plasma.

In some embodiments, the apparatus may further include an optical detector, and the machine readable instructions of the controller may further include instructions for operating the optical detector to measure an emission intensity of an emission band of the plasma, as well as operating the one or more gas flow inlets to set the flow rate of helium and/or neon into the processing chamber in response to the measured emission intensity.

In some embodiments, the one or more gas flow inlets may be further configured for flowing an etchant gas into the processing chamber, and the apparatus may further include a vacuum pump, a valve-controlled conduit to the vacuum pump. In certain such embodiments, the machine readable instructions of the controller may further include instructions for operating the one or more gas flow inlets to flow etchant gas into the processing chamber, and instructions for setting conditions within the processing chamber such that the etchant adsorbs onto the surface of the semiconductor substrate forming an adsorption-limited layer of etchant. The machine readable instructions of the controller may further include instructions for operating the valve-controlled conduit and vacuum pump to remove unadsorbed and/or desorbed etchant from the volume surrounding the adsorbed etchant, and after adsorption of etchant and removal of unadsorbed and/or desorbed etchant, operating the plasma generator to etch a feature on the semiconductor substrate.

In some embodiments, the apparatus may further include a metrology tool for measuring an etch profile of a feature of a semiconductor substrate. In certain such embodiments, the controller may further include instructions for operating the metrology tool to measure an etch profile of the etched feature on the semiconductor substrate, and operating the one or more gas flow inlets to set the flow rate of helium and/or neon into the processing chamber in response to the measured etch profile.

DETAILED DESCRIPTION

Figure 1:
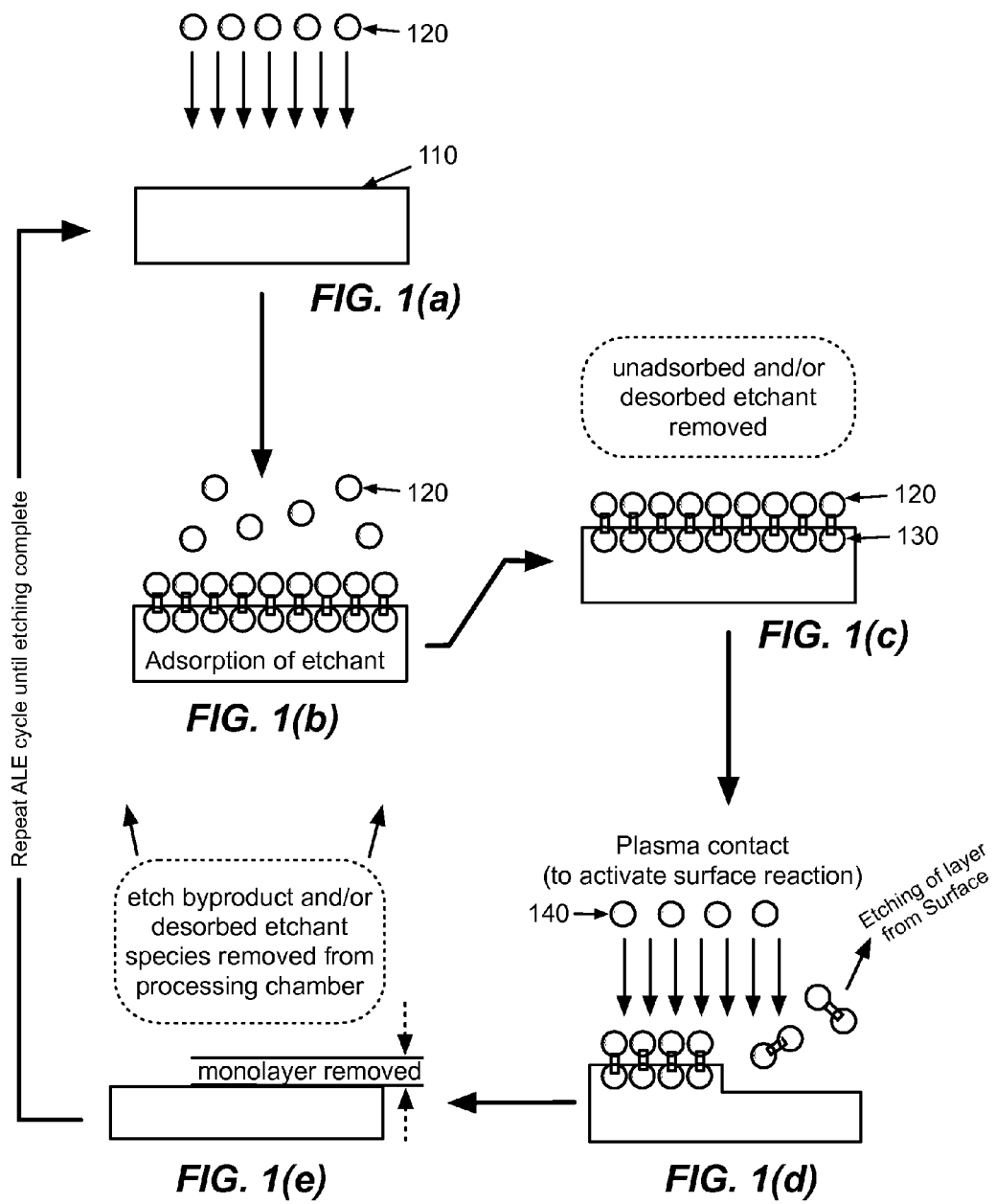
FIGS. 1(a)-1(e) schematically illustrate an atomic layer etch (ALE) process for etching the surface of a semiconductor substrate.

In the following description, numerous specific details are set forth in order to provide a thorough understanding of the present invention. However, the present invention may be practiced without some or all of these specific details. In other instances, well known process operations or hardware have not been described in detail so as to not unnecessarily obscure the inventive aspects of the present work. While the invention will be described in conjunction with specific detailed embodiments, it is to be understood that these specific detailed embodiments are not intended to limit the scope of the inventive concepts disclosed herein.

Atomic Layer Etching Techniques and Operations

Now described are etching techniques, operations, methodologies, etc. for etching features on the surface of a partially fabricated semiconductor substrate. In some embodiments, the etching techniques may employ a process akin to atomic layer deposition (ALD), where a surface reaction, in this case a reaction that etches the surface, may be controlled with atomic layer precision. In some embodiments, depending on the manner in which such an atomic layer etch (ALE) technique causes activation of the surface reaction, a substrate feature may be etched vertically, but substantially not horizontally; for example, an etching operation may etch the bottom/base of a feature but not substantially etch its sidewalls. Such selectivity is partially enable by the adsorption limited nature of the etch process, as well as (as was stated) the manner of the activation. The schematic substrate cross-sections shown in FIGS. 1(a)-1(e) illustrate such an atomic layer etch (ALE) process.

As shown in FIG. 1(a), in some embodiments, such an ALE process may begin by introducing a chemical species used for etching 120—i.e., an etchant species—into a processing chamber in order that the etchant 120 be delivered to the surface of the substrate 110 (as indicated by the downward arrows in the figure). In some embodiments, the etchant may be a halogen-containing species, and in certain such embodiments, a fluorine-containing species such as $XeF_2$, $BrF_3$, $IF_5$, $ClF_3$, etc. In some embodiments, the etchant may be a halogen- and carbon-containing species such as fluorocarbons, for example, $C_4F_8$. Other examples may be $F_2$, $CF_4$, $CHF_3$, $CH_2F_2$, $CH_3F$. In some embodiments, the etchant may be a chlorine containing species such as $Cl_2$, $CCl_4$, $CHCl_3$, $CH_2Cl_2$, $CH_3Cl$, $BCl_3$, for example.

After its introduction into the processing chamber, the etchant 120 (or a portion of the etchant) adsorbs onto the surface of the substrate 110 such that it forms an adsorption-limited layer atop the surface 110. Oftentimes this adsorption-limited layer may be described as a monolayer, roughly having a uniform thickness of a single adsorbed molecule. Where conditions are such that this is the case, monolayer formation is oftentimes a consequence of the chemisorption process requiring an exposed surface on which to adsorb—i.e., a single adsorbed atom or molecule at a given point on the surface prevents further adsorption at that point.

Such adsorption of a monolayer of etchant 120 onto the surface 110 to be etched is schematically illustrated in FIG. 1(b). FIG. 1(b) schematically illustrates the etchant 120 binding directly to the top layer 130 of the surface of the substrate. While the ALE methods disclosed herein are not limited to regimes where there is actual chemical bonding between etchant 120 and the top layer 130 of the substrate surface, in some cases chemical bonding, such as covalent bonding, may occur. In other cases, other forms of attractive interactions may exist between etchant and the substrate surface upon adsorption of the etchant.

The etchant and top layer of the substrate surface are portrayed in FIGS. 1(a)-1(d) as "balls" and their binding to each other as "sticks," yet it should be noted that each such species portrayal as a single "ball" should not be interpreted to imply that each such species are necessarily atomic species. Rather, the etchant and the substrate surface species may be multi-atom molecular species as well, depending on the embodiment. The simple "ball-and-stick" drawings are used to provide a basic illustration of the surface adsorption process. It should also be noted that the adsorbed species may not constitute the complete etchant introduced into the processing chamber, despite the fact that FIGS. 1(a)-1(b) show, for sake of simplicity, the same species being introduced and subsequently adsorbed. In other words, in some embodiments, only a portion of the etchant may be adsorbed.

For instance, if the etchant introduced into the processing chamber is $Cl_2$, the adsorbed etchant may be atomic chlorine (Cl) radicals or chlorine atoms covalently bonded to the substrate surface. Thus, in this example, it might be said that technically atomic chlorine (Cl) is the species that does the etching. Nevertheless, for sake of clarity and simplicity, the etchant introduced into the processing chamber (molecular $Cl_2$ in this example) and the species that is actually adsorbed (atomic Cl in this example) both may be referred to herein as the "etchant," with the understanding that the phrase refers to a compound which is, or is the source of, the species which is actually adsorbed onto the surface and effectuates the etching as described herein.

It should be noted that the adsorption process can be plasma-enhanced or can be achieved by exposing the substrate surface to the neutral etchant gas. It should also be noted that although FIG. 1(b) schematically illustrates adsorption of etchant onto a horizontal surface, generally, the etchant may also be adsorbed onto the sidewalls of a substrate feature being etched. However, for the reasons described below, this doesn't necessarily result in the etching and potentially etching away of the sidewalls.

After adsorption has occurred, as shown in FIG. 1(c), excess unadsorbed (possibly including desorbed) etchant are removed from the processing chamber in order to prevent their interference with the activation and reaction of the chemisorbed species (e.g., potential concurrent gas-phase reaction) in subsequent steps of the etching process. In some embodiments, removal of excess un-adsorbed etchant may be accomplished by pumping un-adsorbed etchant out of the processing chamber. In some embodiments, removal may be accomplished by purging the processing chamber with an inert gas. In some embodiments, a combination sequence of pumping the reaction chamber down to a base pressure to remove un-adsorbed species and then purging, or vice versa, may be employed.

Once an adsorption-limited layer of the etchant is formed on the surface of the substrate and un-adsorbed precursor removed from the processing chamber, a reaction is activated between the adsorbed etchant and the top layer of the surface to which the etchant is adsorbed. As shown in FIG. 1(d), this results in the etching away of some of the surface. FIG. 1(c) schematically illustrates the adsorption-limited layer being exposed to the electronically excited species of a plasma 140 in order to activate the surface reaction.

Finally, in some embodiments, after the surface-mediated etching reaction has proceeded as shown in FIG. 1(d), by-product(s) which were generated by the etching reaction may be removed from the processing chamber as shown in FIG. 1(e). This may be accomplished by a pump-to-base (PTB), and/or purge of the processing chamber with an inert gas, etc. In embodiments, where the adsorption limited layer contained chlorine as an etchant, the by-products may include chlorine-containing species and should be dealt with appropriately.

FIGS. 1(a)-1(e) schematically depict an example sequence of events constituting a single cycle of atomic layer etch (ALE). Thus, in general a single ALE cycle may include operations of adsorbing an etchant onto the surface of a semiconductor substrate such that the etchant forms an adsorption-limited layer on the surface, and thereafter removing unabsorbed and/or desorbed etchant from the volume surrounding the adsorbed etchant. Such a single ALE cycle may then proceed with plasma generation within the processing chamber, and contact of the adsorbed etchant with the plasma to etch the surface of the substrate. After the plasma-activated etch, an optional post-etch removal operation may remove etch byproducts and/or desorbed etchant from the volume surrounding the etched substrate.

However, since each ALE cycle only constitutes the reaction of a single adsorption-limited layer of etchant, typically only a single monolayer is removed from the substrate surface as shown in FIG. 1(e), and so a cycle of ALE operations is typically repeated multiple times in order to substantially etch away an appreciable amount of the substrate surface. Thus, this repetition of etching cycles is schematically indicated in FIG. 1 by the arrow joining FIG. 1(e) with FIG. 1(a). It is noted that the layer of etchant adsorbed in each cycle is oftentimes referred to as a conformal layer—i.e., a layer having a substantially uniform thickness and which substantially conforms to the shape of the features onto which it is adsorbed. As such, the amount of reactive etchant to which any portion of the substrate is exposed during each cycle is consistent and repeatable thereby lending uniformity, controllability, and selectivity to the overall multi-cycle ALE process.

Referring again to the plasma-activation operation shown in FIG. 1(d), the plasma may include ions, free-radicals, and neutral non-radical species, and contact with one or more of these species with the adsorption-limited layer may serve to accomplish activation of the surface reaction. Depending on the embodiment, the plasma may be created/struck in the processing chamber, or it may be introduced into the processing chamber from a remote plasma source, or a combination of the foregoing may be employed. Typically, if ions are used to activate the surface reaction, an ion-based plasma is generated within the processing chamber, and if free-radical species are used to activate the surface reaction, they may be introduced into the processing chamber from a free-radical-based plasma generated remotely from the processing chamber—i.e., from a remote free-radical-based plasma source. In some embodiments, the plasma may contain a substantial number of both free-radical species and ionic species. The plasma may be formed from/comprise an inert gas such as He, Ar, Ne, Kr, and/or Xe.

When an ion-based plasma is used to activate the surface reaction, ions of the plasma may be driven towards the substrate by an applied electromagnetic (EM) field. The applied EM field may generate a constant flux of impacting species, or it may generate pulses of impacting species through pulsation of the EM field. In addition, the applied EM field may be maintained specifically so as to accelerate ions to a particularly selected/desired kinetic energy level. Though this may resemble an ion-based sputter etch technique, the difference is that in a typical ALE process, the ions have a kinetic energy below the sputter threshold of the impacted material; because in ALE processes the energy transferred by the impinging ions need only be sufficient to activate the surface reaction of the adsorbed etchant, rather than sufficient to collisionally ablate layers from the surface by sheer kinetic energy alone. Thus, for example, in the ALE techniques disclosed herein, the ion species may contact the adsorption-limited layer of etchant (as in FIG. 1(d)) by impacting it with a relative kinetic energy of less than 100 electron volts (eV), or a relative kinetic energy of less than 30 eV, or even less than 10 eV. Of course, if free-radical species are used to activate the reaction, these are oftentimes plasma-generated as well, and also typically have a lower kinetic energy. In any event, because what is used to activate the surface reaction—e.g., it could be viewed as impinging molecular beam of plasma species—imparts much less energy to the underlying substrate than an ion-based sputter etch, the atomic layer etch (ALE) technique has the potential to be far less damaging to the underlying surface, and far more controllable and specific to the portions of the substrate desired to be etched such as when employed with the use of an etch mask.

Plasma activation of the adsorbed etchant may also act as an additional mechanism for controlling the specificity of the etching process. In particular, when an applied EM field is used to direct plasma flux towards the substrate surface, the strength of the EM field may be such that the species of the plasma are imparted with velocities substantially perpendicular to the plane of the substrate, and thus, when they collide with the substrate—due to their substantial lack of any horizontal velocity component—these plasma species contact feature sidewalls much less frequently than feature bottoms. Accordingly, this causes preferential activation of the etching reaction at the base of substrate features versus on feature sidewalls thereby working to preserve the critical dimension (CD) and feature aspect ratios (ARs). In the context of etching a substrate covered with an etch mask layer, directing the impinging plasma species vertically downward (i.e., substantially perpendicular to the plane of the substrate) causes the etch process to etch downward into the substrate, in regions not protected by the etch mask, rather than to etch sideways or horizontally in such regions. The extent to which the etch is vertical may be said to be its degree of anisotropy, in contrast to the extent to which the etch process is isotropic or has equal horizontal and vertical components. In many cases, a vertical anisotropic etch is preferred since it etches downward into the substrate without substantial horizontal etching of feature sidewalls which would cause the sidewalls to become "bowed"—in some cases, even to the extent that a horizontal etch component may remove material from underneath the etch mask (the masked regions being defined vertically by the edges of the etch mask).

However, there are also cases where etching sideways via an isotropic etch is desired, and even cases where an etch process is designed to be substantially vertically anisotropic during one phase, and then isotropic in another subsequent (or preceding) phase. One example concerns the fabrication of a so-called gate-all-around (GAA) FET (a potential successor to FINFET designs), wherein the gate electrode wraps 360 degrees around the doped channel region of the transistor, in essence, forming a nanowire. In this type of design, it may be desirable to etch anisotropically—vertically down the sides of the channel—and then to etch isotropically—sideways underneath the wire-shaped channel—so that these etched-out regions can be filled with the appropriate conductive gate-electrode material and thereby wrap the gate all-around (GAA) the channel. Accordingly, the fabrication of next generation IC designs may benefit greatly from incorporation of etch processes wherein the degree of etch anisotropy may be adjusted, controlled, and/or tuned "on the fly" via changing one or more process parameters.

Adjusting and/or Controlling Emission of VUV from the Etch-Activating Plasma

Recently, it has been found that while a variety of inert gases such as Ne, Xe, Kr, Ar, and combinations thereof may serve as effective gases for forming the plasma used to activate the surface etch reaction in an ALE process, the use of helium in combination with one or more of the foregoing gases provides added benefits in various embodiments. Without being limited to a particular theory, it is thought that the small size of the helium atom imparts the helium component of the etch-activating plasma with the ability to penetrate (or more deeply penetrate) into the structure of the adsorbed layer of etchant or even into the structure of the underlying material being etched, thus more effectively activating the etch reaction therein.

Figure 2:
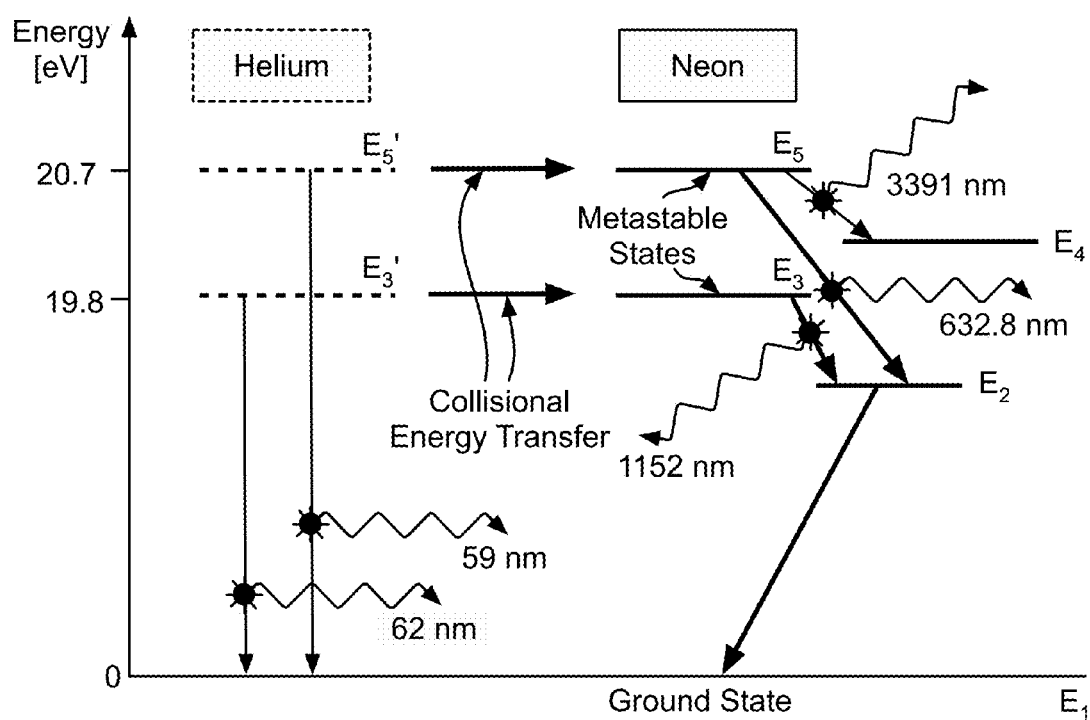
FIG. 2 presents energy level diagrams for helium and neon illustrating that certain excited states of neon line-up energetically with certain excited states of helium, and hence that resonant energy transfer from helium to neon may be induced.

Accordingly, ALE operations employing a plasma based on helium may beneficially be employed. However, one issue with helium that may occur when it is used as a plasma component in certain types of etch processes is that several of its excited states emit vacuum ultraviolet (VUV) radiation. FIG. 2, discussed in detail below, illustrates two excited states of helium separated from the ground state by 20.7 and 19.8 electron volts (eV), and that these excited states decay to the ground state via the emission of 59 and 62 nanometer (nm) photons, respectively, short wavelength light well into the VUV range (considered to be about 200 to 10 nm or about 6.20 to 124 eV).

VUV radiation has very high energy and, as such, emitted VUV photons may themselves cause surface etching (e.g., through activating the reaction of surface adsorbed etchants), and since VUV photons are emitted isotropically (in this case from helium), they etch the substrate isotropically. This may pose a problem if a controlled anisotropic etch with a specific directionality is desired (e.g., perpendicular to the surface of the substrate). On the other hand, if an isotropic etch is desirable in a particular process, isotropic emission of VUV photons may provide a benefit.

However, as described further herein, in some situations, the isotropic nature of VUV emission may be harnessed to provide control and/or adjustability to the degree of isotropy/anisotropy in an ALE process. For instance, if the etch-activating plasma used in an ALE process includes a VUV-emitter such as helium, then a mechanism for adjusting and/or controlling the degree of VUV emission from this plasma component may also provide a mechanism for adjusting and/or controlling the isotropy/anisotropy of the ALE process. One way of achieving this is to include an additional gas in the etch-activating plasma which serves to de-excite the emitter gas (at least to a certain extent) and absorb energy from it before the emission of VUV photons is taking place. A mechanism for this transferring of energy to occur is through inelastic collisions between atoms of the VUV emitter gas and atoms of the energy absorber gas. Thus, for the case of helium, an energy absorber gas may be used to collisionally de-excite the helium before it has a chance to emit VUV photons.

One such energy absorber gas which may be successfully used to de-excite helium is neon. The energetics of this process are schematically illustrated in FIG. 2. It is noted that the principal of collisional energy transfer from helium to neon has long been utilized in helium-neon lasers. The right side of the figure illustrates 4 electronically excited states of neon having energies $E_2$, $E_3$, $E_4$, and $E_5$, along with the ground state having energy $E_1$. The left side of the figure illustrates 2 electronically excited states of helium having energies $E_3'$ and $E_5'$. (For sake of simplicity, each electronically excited state will be referred to by its corresponding energy, $E_2$, $E_3$, $E_3'$, etc.) As indicated in the figure, the $E_3'$ and $E_5'$ excited states of helium have energies of 19.8 eV and 20.7 eV, respectively, relative to the ground state $E_1$ (taken to be 0 eV). Furthermore, as indicated in the figure, the $E_3'$ and $E_5'$ excited states of helium may radiatively decay to the ground state $E_1$ via emission of VUV photons of wavelengths 62 nm and 59 nm, respectively.

However, FIG. 2 also illustrates that helium's excited states having energies 19.8 eV and 20.7 eV, labeled $E_3'$ and $E_5'$, are very close in energy to two of neon's electronically excited states, labeled $E_3$ and $E_5$. The small energy offset between E3 and E3' as well as between E5 and E5' (~50 MeV) may be supplied by the kinetic energy of the atoms that take part in a collision. As a consequence, resonant energy transfer from helium (in one of these excited states) to neon may be collisionally induced (as indicated in the figure). For instance, helium in excited state $E_3'$ may return to its ground state non-radiatively by collisional energy transfer to neon which is then excited from its ground state $E_1$ to excited state $E_3$. Likewise, helium's excited $E_5'$ state may be non-radiatively quenched through collisional energy transfer and excitation of neon from its ground state $E_1$ to excited state $E_5$.

This helium to neon resonant energy transfer would not have the desired effect, of course, if neon once excited then itself emitted VUV photons. However, as shown by FIG. 2's illustration of the decay pathways for neon, neon decays predominantly from its $E_3$ and $E_5$ excited states to an intermediate $E_2$ state, and the energy gap between states $E_5$ and $E_2$, as well as between states $E_3$ and $E_2$, corresponds to photons emitted in the visible or infrared range but not in the high-energy VUV range. In particular, radiative decay from neon's $E_5$ to $E_2$ state generates 632.8 nm photons (visible, red), and decay from neon's $E_3$ to $E_2$ state results in the emission of 1152 nm photons (infrared).

To complete the cycle, neon must return to its ground state so that it can again collisionally absorb energy from helium. However, neon is unable to return to its ground state $E_1$ from excited state $E_2$ by optical emission; it requires collisional de-excitation. This is accomplished through collisional energy transfer between neon atoms with the physical structure of the processing chamber (e.g., the plate electrodes used to generate the plasma, the walls of the processing chamber, or some other structure), which effectively acts as an adsorptive bath for the remaining electronic energy. It should be noted that the de-excitation of neon's E2 state requires process chamber designs with a small path way for neon atoms such that they can reach the walls in a short amount of time. Specifically, plasma processing chambers with a narrow chamber gap are required to support the helium-neon collisional energy transfer process Thus, the accompaniment of helium by neon in the etch-activating plasma provides a mechanism by which the emission of VUV radiation from said plasma may be adjusted and/or controlled, and this capability opens up the possibility of adjusting and/or controlling the degree of anisotropic etching in an ALE process. In fact, during the course of an etch involving multiple ALE cycles (as is typical since a single cycle of ALE only removes a small thickness of material due to the adsorption-limited amount of etchant used in each cycle), the emission of VUV radiation from the plasma used to activate the surface etch reaction may be adjusted one or more times to achieve one or more VUV emission profiles (e.g., to vary etch anisotropy) during the etch process.

This capability allows an ALE process, for example, to begin as a substantially anisotropic vertical etch (through the influence of an applied EM filed as described above), and then after some number of cycles (and/or the satisfaction of some other process parameter or substrate property) convert to an isotropic etch by increasing the level of VUV emission from the etch plasma. Subsequently, it could be converted back to an anisotropic vertical etch as well, and so forth depending on the sort of substrate features being fabricated.

For instance, one particular scenario where such control may be useful is the example mentioned above of the so-called gate-all-around (GAA) transistor. In this type of design, it may be desirable to etch anisotropically—vertically down the sides of the GAA transistor's channel region—and then to etch isotropically—so that there is a substantial sideways component which etches underneath the wire-shaped channel region—and the control of etch anisotropy provided by having an adjustable VUV emission intensity may provide a mechanism to achieve this capability.

In other embodiments, such as in a typical feature etch employing an etch mask (as opposed to gate formation in the latest GAA design), the goal may be to etch as substantially vertically as possible—i.e., perpendicular to the plane of the substrate—because a horizontal etch component may etch underneath the etch mask and cause damage to the substrate device structures being formed. In this scenario, it is desirable to minimize the isotropic etch component for the entire etch to the extent this is feasible, and thus, in order to achieve this, plasma composition may be adjusted so as to consistently minimize VUV emission. While this may be the most common scenario, there are cases, such as in "isotropic ALE," where it is desirable to maximize isotropy and thus VUV emission. In general, different phases of an etch process may be desired to be isotropic or anisotropic to a different extent and therefore, depending on the embodiment, it may be feasible to achieve each target etch isotropy/anisotropy during the different phases by changing the plasma VUV emission through alteration of plasma composition.

In some embodiments, adjustment of VUV emission may involve altering the concentration ratio of VUV emitter gas to collisional energy absorber gas in the plasma. For the case where the VUV emitter gas is helium and the collisional energy absorber gas is neon, this could be done for example by flowing helium and/or neon into the processing chamber in a proportion so as to alter the concentration ratio of helium to neon in the plasma. If there is a continuous feed of helium and neon into the processing chamber, than the relative proportions in the feed could be altered to change the plasma composition. If there is no continuous feed but instead just a fixed and previously flowed quantity of helium and neon in the chamber, then a flow of one or the other could be established to alter the proportion in the chamber. In any event, if a flow is used to alter the relative proportions, then depending on the desired VUV emission profile, emission intensity may be adjusted upward by flowing helium into the processing chamber so as to increase the ratio of helium to neon in the plasma, or adjusted downward by flowing neon into the processing chamber so as to decrease the ratio of helium to neon in the plasma. Flow into the chamber of either the VUV emitter or the collisional energy absorber or both could be balanced by removal of gas from the chamber so that the total chamber pressure remains at the desired level. Thus, by using various gas mix ratios between helium and neon, the amount of VUV emissions coming from the etch-activating plasma may be tuned. One sees that the highest VUV emission intensity is produced by a gas mixture of little or no neon and that the lowest VUV emission intensity is produced by a gas mixture of about 50% neon or greater.

Several experiments were performed to demonstrate how the VUV emission intensity from a helium plasma may be varied by including neon in the plasma and by altering the relative proportion of helium to neon in the plasma. Experiments were performed in two different etch chambers.

Figure 3:
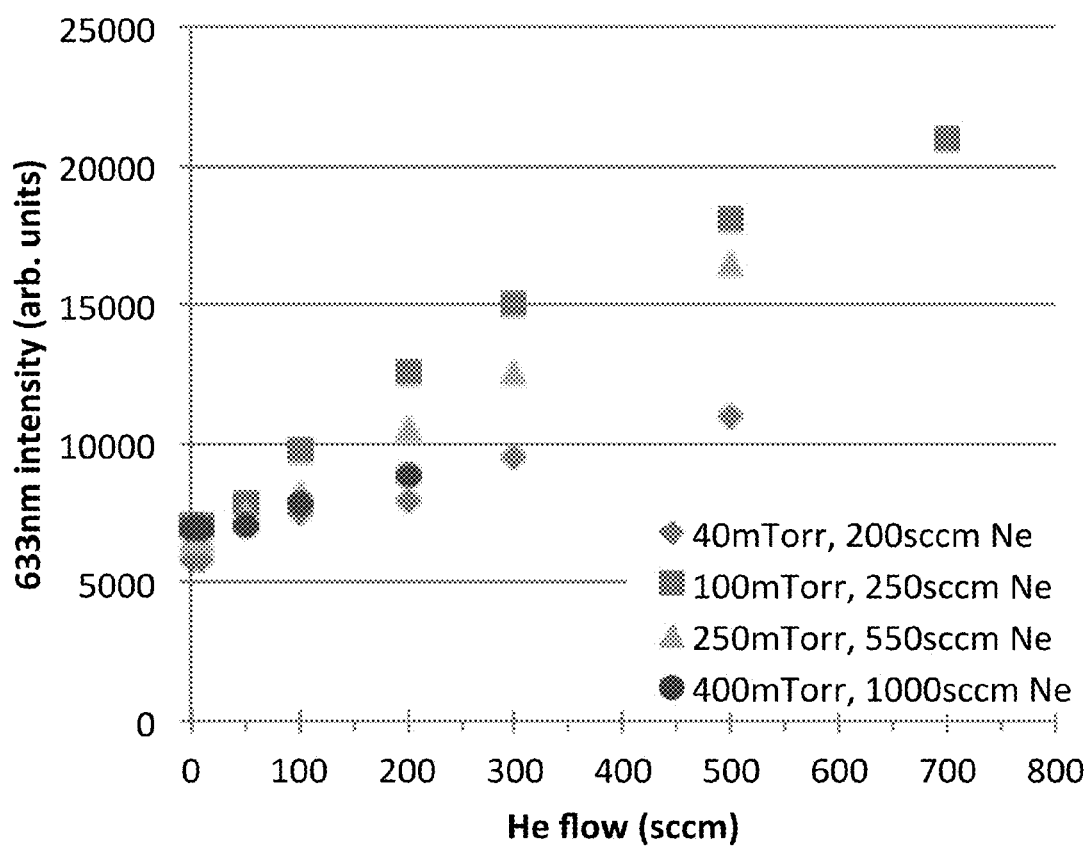
FIG. 3 plots the emission intensity of neon's 632.8 nm line from a helium-neon plasma generated in a capacitively coupled plasma (CCP) reactor having a small chamber gap of approximately 1 inch. Specifically, neon's 632.8 nm emission intensity is plotted versus helium flow into the CCP reactor at 4 different chamber pressures (corresponding to 4 different neon partial pressures).

The first of these etch chambers was an capacitively coupled plasma (CCP) reactor, which as set up in this case is an example of a small-gap reactor—here, specifically, having a gap between the substrate holder and the other plate-shaped electrode (between which the plasma is generated) of only 24 mm (approximately 1 inch). The small gap promotes collisions between neon and the structure of the plasma chamber, leading to enhanced collisional energy transfer with the chamber and faster relaxation of neon's $E_2$ state to its ground state. Results corresponding to the helium-neon plasmas generated in this chamber and illustrating the VUV adjustment capability are shown in FIG. 3. Specifically, FIG. 3 plots the emission intensity of neon's 632.8 nm line versus helium flow into the CCP reactor for 4 experiments performed at 4 different chamber pressure levels. The 4 pressures ranged from 40 mTorr to 400 mTorr as shown in the figure's legend (with higher total chamber pressures corresponding to higher neon partial pressures). Note that emission from neon's 632.8 nm line is used to assess energy flow from helium to neon through the collisional resonant energy transfer process shown in FIG. 2 because VUV emission is difficult to measure directly in practice (due to VUV being adsorbed outside a high vacuum environment).

The experimental results in FIG. 3 illustrate, at each of the 4 different total chamber pressure levels, the dependence of the ~633 nm emission intensity on helium flow: more helium presumably generates more VUV emission, but also increases the frequency of collisions between helium and neon, leading to more collisional de-excitation of helium, more energy to flow to neon, and thus more 633 nm emission. The experiments also show that for a given helium flow rate the total chamber pressures of 100 mTorr and 250 mTorr (corresponding to neon flow rates of 250 and 550 sccm, respectively) display the highest 633 nm emission, and therefore the greatest energy transfer from helium to neon and the strongest suppression of VUV emission. Without being limited to a particular theory, it is thought that these intermediate chamber pressure levels result in increased helium to neon energy transfer by providing a balance between helium-neon collisional frequency and the frequency of collisions between neon and the structure of the processing chamber. Higher pressures increases the frequency of helium-neon collision events but, if the pressure is too high, neon's mean free path is reduced to such an extent that neon atoms in the plasma's interior do not reach the structure of the processing chamber with sufficient frequency needed for their own de-excitation, and without this, the energy transfer cycle shown in FIG. 2 cannot be completed. (See the above discussion of neon's decay from the $E_2$ excited state.) It is therefore concluded based on these experiments that there is generally some optimal neon partial pressure level which tends to provide the greatest VUV suppression at a given helium partial pressure level.

Figure 4:
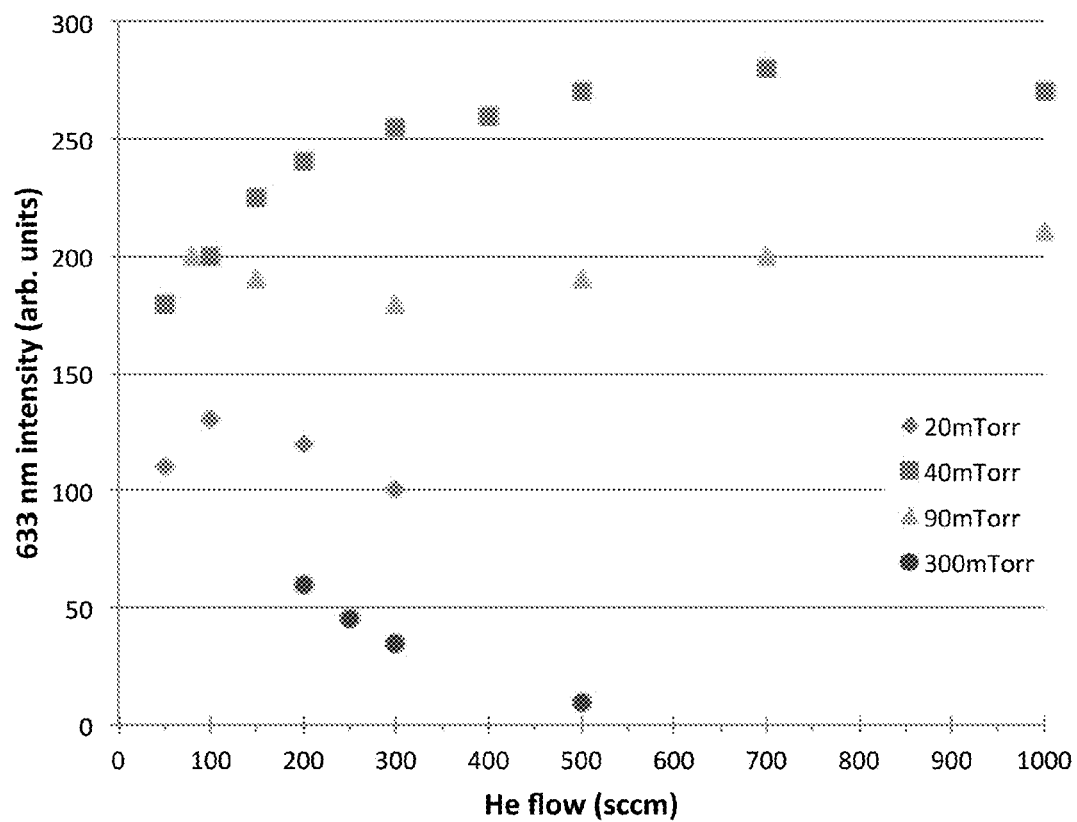
FIG. 4 plots the emission intensity of neon's 632.8 nm line from a helium-neon plasma generated in an inductively coupled plasma (ICP) reactor having a large chamber gap of approximately 6 inches. Specifically, neon's 632.8 nm emission intensity is plotted versus helium flow into the ICP reactor at 4 different chamber pressures (corresponding to 4 different neon partial pressures).

Analogous experiments performed in a second type of etch chamber are shown in FIG. 4. The second etch chamber was an inductively coupled plasma (ICP) reactor, which is an example of a large-gap reactor, in this case having a gap between the substrate holder and the plasma generating hardware of approximately 6 inches. The large gap reduces the frequency of collision between neon and the structure of the plasma chamber (relative to a small-gap reactor), leading to a much reduced collisional de-excitation of neon and a much slower relaxation from neon's $E_2$ state (to its ground state).

Like FIG. 3, FIG. 4 shows the results of 4 experiments performed at different total chamber pressure levels, and plots the emission intensity of neon's ~633 nm line versus helium flow into the reactor for each of the experiments. Here, total chamber pressures for the 4 experiments ranged from 20 mTorr to 300 mTorr, and again, it is seen that for a given helium flow rate, intermediate chamber pressures lead to the maximum VUV suppression capability. However, for the case of this large-gap reactor, the intermediate chamber pressures which lead to the highest 633 nm emission were 40 mTorr and 90 mTorr, a significantly lower range than the 100 mTorr and 250 mTorr pressure levels seen to best promote VUV suppression in the small-gap reactor (see FIG. 3). Moreover, even at 40 mTorr, the experiments in the large-gap reactor result in only a faint 633 nm signal, indicating that there is little VUV suppression taking place. Once again, and without being limited to a particular theory, it is thought that at some point higher pressures reduce neon's mean free path to an extent that it cannot frequently reach the structure of the processing chamber needed for its own collisional de-excitation, and without this, the energy transfer cycle shown in FIG. 2 cannot be completed. Since the distance neon must travel to reach the structure of the etch chamber is significantly greater in a large-gap reactor versus a small-gap reactor, the pressures at which VUV suppression may be achieved are lower than in a small-gap reactor. Thus, it is concluded that VUV suppression, adjustment, and/or control in a large-gap reactor (such as the ICP reactor used in these experiments) is limited to certain low pressure regimes. In any event, FIGS. 3 and 4 do demonstrate that a collisional energy transfer process between a VUV emitter gas and energy absorber gas may be used in various etch chambers to control and/or adjust VUV emission.

It is thus noted that etch reactors employing a small chamber gap, such as may be provided in a CCP reactor, provide a significantly enhanced opportunity for control and/or adjustment of VUV emission relative to what may be done in a typical large-gap reactor, such as a typical ICP reactor. However, it is noted that, in some embodiments, it may be possible in practice to modify a typical ICP reactor (or other large-gap reactor) to add one or more components which provide a structure against which neon atoms may collide despite having a low mean free path as a consequence of a higher pressure regime. For example, a grid or mesh provided within the gap region of a large-gap reactor may be such a structure. Another example would be a set of concentric cylinders (possibly having gaps, holes, etc.) oriented with their central axes perpendicular to the plane of the substrate. Of course it should be understood that in some embodiments, as described above, one may wish to tune VUV emission intensity for a particular application, and so achieving maximum VUV suppression may not in fact be the goal.

Figure 5:
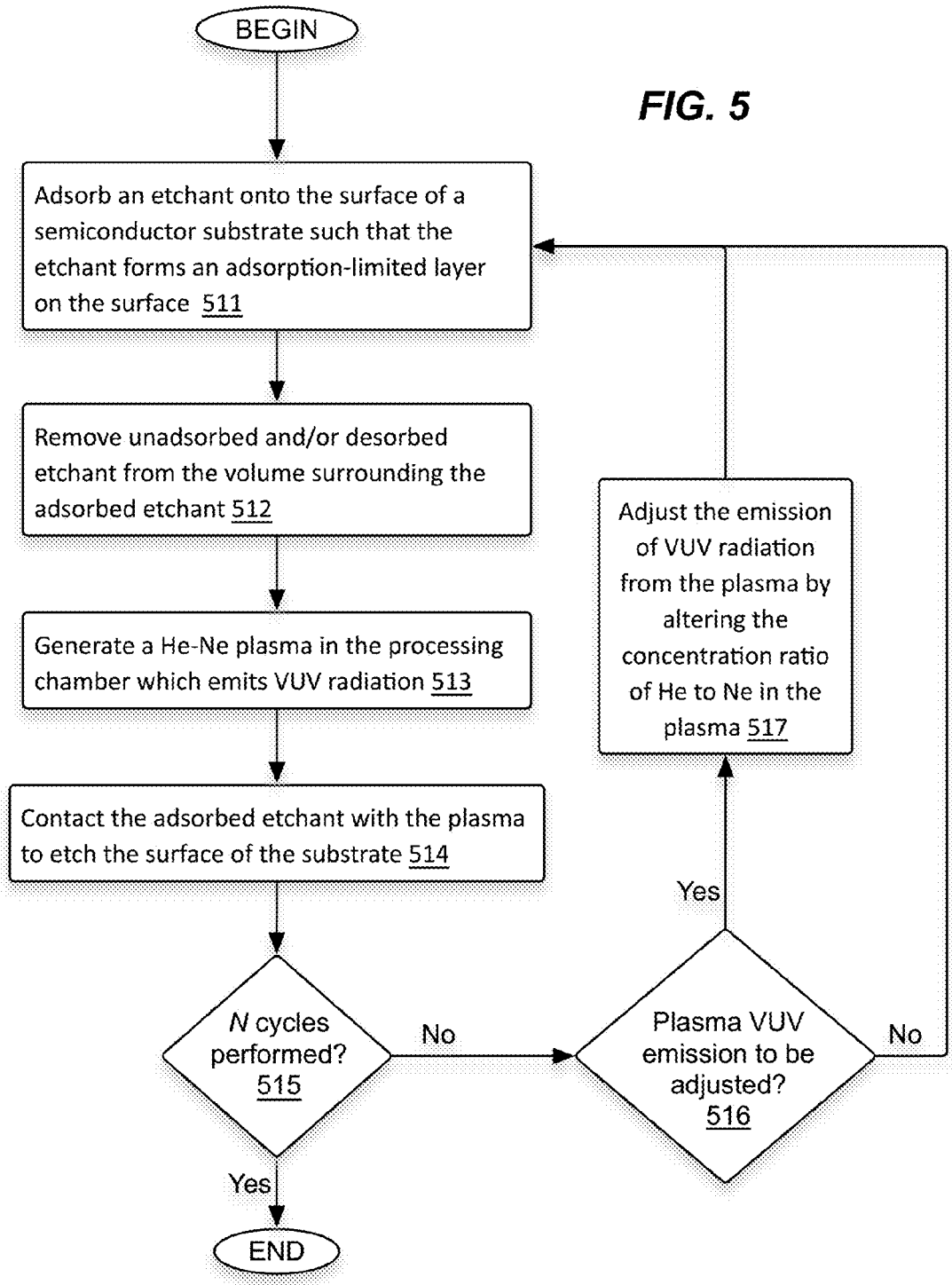
FIG. 5 is a flowchart of an atomic layer etch (ALE) process employing VUV emission adjustment and/or control.

Accordingly, in view of the foregoing capability of controlling and/or adjusting the emission of VUV radiation from a plasma in an etch chamber, disclosed are atomic layer etch (ALE) techniques which utilize an etch reaction-activating plasma and which employ one or more operations of adjusting the emission of VUV radiation from said plasma. FIG. 5 provides a flowchart view of such a cyclic ALE process employing VUV adjustment. As shown in the figure, the cyclic ALE process begins with the operation 511 of adsorbing an etchant onto the surface of a semiconductor substrate such that the etchant forms an adsorption-limited layer on the surface, followed by operation 512 of removing unabsorbed and/or desorbed etchant from the volume surrounding the adsorbed etchant. Then, as shown in the figure, in operation 513, a helium-neon plasma is generated in the processing chamber which emits VUV radiation, and the adsorbed etchant is then contacted with the plasma in operation 514 to etch the surface of the substrate.

At this point, a single ALE cycle has been performed resulting in the etching away of one layer of substrate material. Because multiple ALE cycles typically make up an etch process, FIG. 5 next indicates that the foregoing ALE cycle may be repeated an arbitrary number, say N, times in order to accomplish a particular ALE process sequence. Thus, after the surface is etched in operation 514, the process proceeds to logic block 515 where it is determined whether N ALE cycles have been performed. If the specified number of N ALE cycles have been performed, the process ends. Otherwise, if less than N cycles have been performed, the process proceeds to logic block 516.

Logic block 516 is concerned with determining whether or not the VUV emission intensity of the etch-activating plasma may be beneficially adjusted. Depending on the intensity of the VUV radiation emitted from the plasma, as well as other factors, the substrate etch done in the preceding ALE cycle may have been substantially isotropic or it may have had a substantial anisotropic component, and moreover, the degree of isotropy/anisotropy during the preceding ALE cycle may have been optimal, or it may have been suboptimal in some respect.

Thus, in some embodiments, a property of the etch-activating plasma may be measured in order to determine whether it is sufficiently isotropic or anisotropic for the particular ALE process being employed. For instance, the emission intensity of an emission band of an excited state species of the etch-activating plasma may be measured in order to assess the strength of the plasma's VUV emission and thus its degree of isotropy/anisotropy. In certain such embodiments, the measured emission band may be neon's visible band centered at 632.8 nm, as illustrated in FIGS. 3 and 4.

In other embodiments, determining whether or not VUV emission adjustment is warranted may be assessed based on a property of the etched substrate. For instance, the profile of one or more substrate features etched in the ALE process may be measured with a metrology tool to determine whether VUV emission adjustment may be beneficial. More particularly, for example, a measured bowing of the sidewalls of an etched feature may indicate that the plasma should be made less isotropic and VUV emission reduced.

In still other embodiments, it may be that the etch-activating plasma used in the just-completed ALE cycle was substantially optimal (or at least fairly optimal), but that the overall etch process is such that the degree of anisotropy is supposed to change in the next cycle due to the design of the substrate feature being etched—e.g., change from vertical to horizontal etching to achieve gate formation in a GAA transistor (as discussed above).

Accordingly, as shown in FIG. 5's logic block 516, it is determined whether the VUV emission intensity of the plasma may be beneficially adjusted—e.g., because it was suboptimal in the ALE cycle just completed (as determined from a measured property of the plasma and/or the substrate) or because it is the appropriate time in the overall etch process to adjust it, etc.—and if so, the process proceeds to operation 517 where, as indicated, plasma VUV emission is adjusted by altering the concentration ratio of helium to neon in the plasma. In some embodiments, this may be achieved by setting the flow of helium and/or neon into the processing chamber in response to the measured property in a proportion so as to alter the concentration ratio of helium to neon in the plasma. In any event, once the VUV emission adjustment is done or if the adjustment was determined unnecessary/unbeneficial in logic block 516, the process proceeds to repeat the ALE cycle of operations 511-514 once again.

As depicted, FIG. 5 presents an ALE process sequence which incorporates adjustment of VUV radiation emitted from an etch-activating plasma while etching a single substrate. This may correspond, for example, to the case where a characteristic of the etch-activating plasma and/or characteristic of the etched substrate are monitored while ALE cycles are ongoing. However, in some embodiments, information regarding the characteristics of an ALE process for a given substrate is obtained post-etch. As such, this information may be beneficially employed in the adjustment of process parameters for the etch of the next substrate in a sequence of substrates being processed. In these types of embodiments, a metrology tool used to measure a characteristic of the etched substrate (e.g., the characteristics of one or more etched features on its surface) may (though not necessarily) be a device distinct from the etch process chamber (although possibly on the same cluster tool), and may be used to acquire the foregoing data after the substrate leaves the etch chamber. Thus, for example, in some embodiments, a feedback loop from a separate metrology tool may be established that feeds etch profile information back into the operation of the etch chamber, and if the measured etch profile is not within the requested range of performance, the ratio of helium and neon may be automatically adjusted to compensate. It is noted that while in these sorts of embodiments VUV emission adjustment is performed in the context of a sequence of substrates, the principle illustrated in FIG. 5 still applies: that during a sequence of ALE operations, it may be determined whether the etch process would be benefited by adjusting VUV emission, and if so, the adjustment is made by altering the concentration ratio of helium to neon in the plasma so as to improve subsequent ALE cycles.

Additional ALE Process Parameters in Detail (i) Etchant dose and adsorption: During the etchant dose and adsorption operations of the ALE cycle just described, etchant may be flowed to the reaction chamber at a rate of between about 100 and 250 sccm (standard cubic centimeter per minute), or more particularly between about 150 and 500 sccm. Depending on the embodiment, etchant may be flowed to the reaction chamber such that etchant has a partial pressure in the chamber of between about 50 and 250 mTorr, or more particularly between about 100 and 150 mTorr. The duration of the flow may be for between about 0.5 and 30 seconds, or more particularly between about 10 and 20 seconds. In some embodiments, this step may be plasma enhanced. RF power levels may be between about 100 and 1000 Watts, or between about 200 and 700 Watts, and, in some embodiments, also about 400 Watts RF power to the antenna of an inductively coupled reactor, or at the same power levels to the electrode of a capacitively coupled reactor.

(ii) Post-dose removal of etchant: During the post-dose operation of removing unadsorbed and/or desorbed etchant of the ALE cycle just described, an inert purge of the reaction chamber may be employed. The purge may constitute flowing an inert purge gas (such as He and/or Ne which may be used as removal gases, and also Ar, Kr, and/or Xe) to the reaction chamber at a rate of between about 100 and 500 sccm for between 1 and 10 seconds, or more particularly for between about 1 and 3 seconds, or for about 2 seconds.

(iii) Plasma generation and etch activation: During the plasma-activated reaction/conversion operation of the ALE cycle just described, a plasma may be generated in the processing chamber which includes ions and/or free radicals of the VUV-emitter gas (such as helium) and a collisional energy absorber gas (such as neon). The plasma is formed by applying RF electromagnetic (EM) radiation to these gases once flowed (or while flowing) to the processing chamber. Viable flows for these plasma precursors during plasma generation may be between about 100 and 250 sccm (standard cubic centimeter per minute), or more particularly between about 150 and 500 sccm, or the flow to the reaction chamber may be such as to establish a combined partial pressure of the VUV-emitter gas and collisional energy absorber gas of between about 50 and 250 mTorr, or more particularly between about 100 and 150 mTorr.

RF power for generating the plasma may be between about 30 and 6000 W, or between about 200 and 3100 W, or between about 300 and 1100 W, or between about 350 and 550 W, or between about 30 and 100 W, or about 400 W; with a frequency of 13.56 MHz (although positive integer multiples of 13.56 MHz such as 27.12 MHz, 40.68 MHz, or 54.24 MHz (and sometimes non-integer multiples such as 60 MHz), and so forth may also be used depending on the embodiment, and some frequency tuning about 13.56 MHz or the multiple thereof may also be employed). The RF power may remain switched on for between about 0.1 and 30 seconds resulting in a corresponding exposure time of the adsorbed etchant to the ions and/or radicals of the plasma for between about 0.1 and 30 seconds causing the surface etching reaction. More particularly, RF power may be switched on (and the absorbed etchant exposed to the plasma) for between about 0.5 and 3 seconds, or for between about 0.5 and 2 seconds, or for between about 1 and 2 seconds.

In addition, although conventionally high-frequency plasmas are generated at an RF frequency set to about 13.56

MHz, in some configurations, the frequency may be allowed to float to a value that is different from this standard value. By permitting the frequency to float (typically by about ±5%) while fixing the impedance match to a predetermined load (e.g., a 50 Ohm load, though the load may be frequency dependent), the plasma can stabilize much more quickly, a result which may be important when using the very short plasma durations sometimes associated with ALE cycles. Furthermore, as noted above, in certain embodiments, multiples of the standard HF value of 13.56 MHz (or, in some embodiments, non-multiples such as 60 MHz or 80 MHz) may be used to generate even higher frequency plasmas. As when the standard value of 13.56 MHz is used, HF radiation generated at a higher frequency multiple of 13.56 MHz may also be allowed to be dynamically tuned. Multiples of 13.56 MHz which may be used, depending on the embodiment, include 27.12 MHz (=2*13.56 MHz), 40.68 MHz (=3*13.56 MHz), 54.24 MHz (=4*13.56 MHz), and so forth. The frequency tuning about the multiple of 13.56 MHz may include frequency variation of about ±5%. Higher RF frequencies result in higher plasma density per Watt of RF power, lower sheet voltages, and less ion velocity upon impact on the substrate and directionality which might be beneficial when the goal is to etch isotropically.

(iv) Etch byproduct and/or desorbed etchant species removal: When a post-etch byproduct removal operation is employed in an ALE cycle, removal may be accomplished by purging the chamber with an inert purge gas (e.g., Ar or $N_2$) at a flow rate of between about 100 and 500 sccm for between 1 and 10 seconds, or more particularly for between about 1 and 3 seconds, or for about 2 seconds. In terms of pressure, pressure within the chamber during the purge may be between about 50 and 250 mTorr, or more particularly between about 50 and 150 mTorr. As with the post-dose removal operation described above, in some embodiments, a PTB may also be employed during this post-etch removal. Thus, the removing operations post-dose and post-etch may be done generally via purging, evacuating by pumping down to a base pressure ("pump-to-base"), etc. the volume surrounding the substrate.

Substrate Processing Apparatuses

The methods described herein may be performed with any suitable semiconductor substrate processing apparatus. A suitable apparatus includes hardware for accomplishing the process operations and a system controller having instructions for controlling process operations in accordance with the various plasma VUV emission adjustment and/or control techniques and ALE operations disclosed herein. In some embodiments, the hardware may include one or more process stations/modules included in a multi-station substrate processing tool (as described below), and a controller (as described below) having (or having access to) machine-readable instructions for controlling process operations the apparatus in accordance with the techniques and operations described herein.

Thus, as described more specifically in the context of the various the various capacitively coupled and inductively coupled plasma reactors described below, an appropriate substrate processing apparatus may generally include a processing chamber, a plasma generator, one or more gas flow inlets configured for flowing gases into the processing chamber, a vacuum pump, a valve-controlled conduit to the vacuum pump, and a controller for controlling the operations of these components. In some embodiments, such an apparatus may further include an optical detector for measuring emission intensities of plasmas formed in its processing chamber, and the processing module embodied by the foregoing apparatus may have access to a metrology tool for measuring an etch profile of a feature etched on a semiconductor substrate using this apparatus. The following descriptions illustrate suitable etch chambers in greater detail.

Capacitively Coupled Plasma Reactors for Use in ALE Operations

Capacitively coupled plasma (CCP) reactors which, in certain embodiments, may be suitable for atomic layer etching (ALE) operations employing a chlorine plasma for adsorption and a helium-neon (helium-neon) plasma for desorption wherein VUV emission may be adjusted and/or controlled are described in U.S. Pat. No. 8,552,334, filed Feb. 9, 2009 as U.S. patent application Ser. No. 12/367,754, and titled "Adjustable gap capacitively coupled RF plasma reactor including lateral bellows and non-contact particle seal," hereby incorporated by reference in its entirety and for all purposes.

Figure 6A:
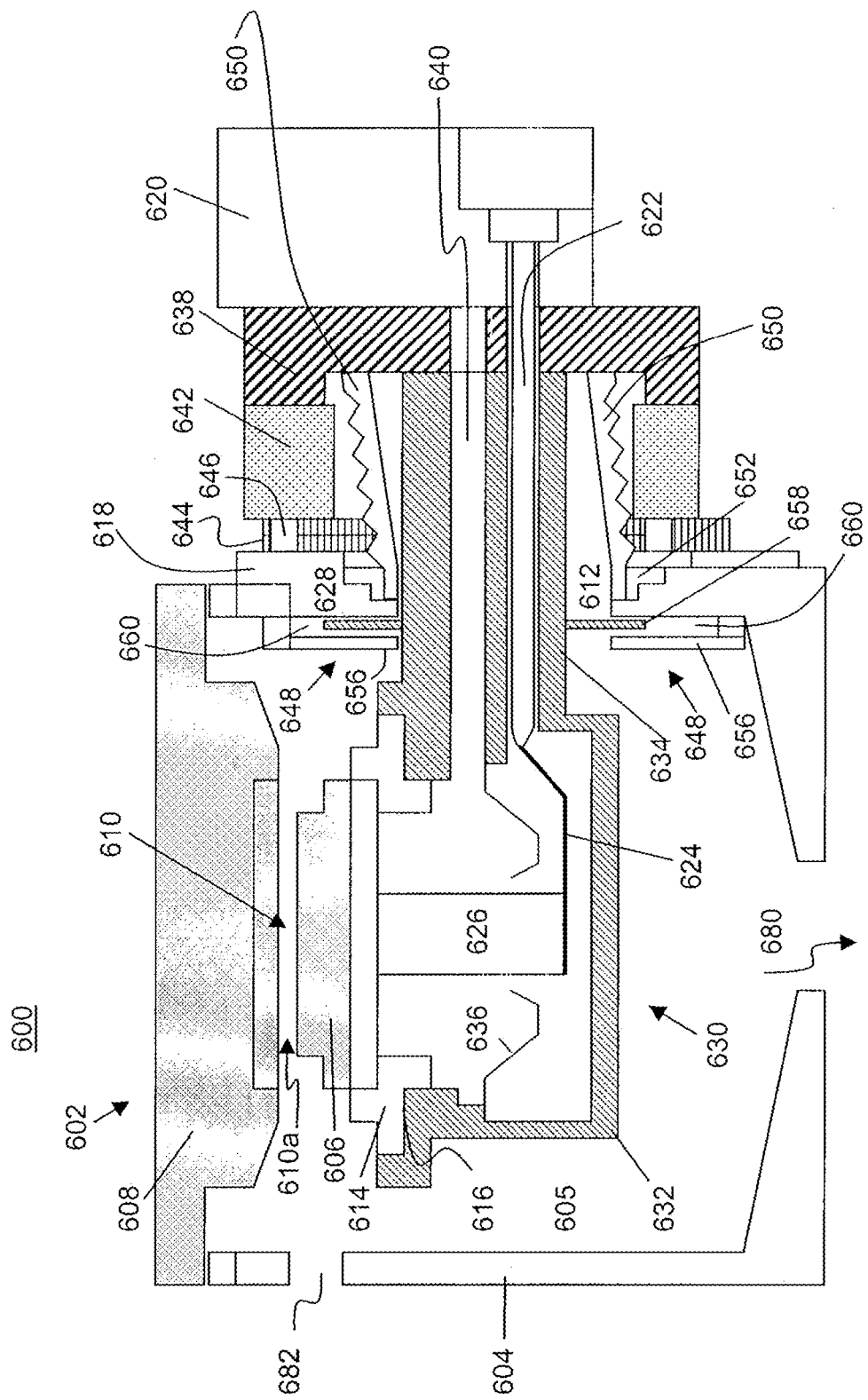
FIGS. 6A-6C are schematics of a capacitively coupled plasma (CCP) reactor appropriate for implementing various ALE processes described herein.
Figure 6B:
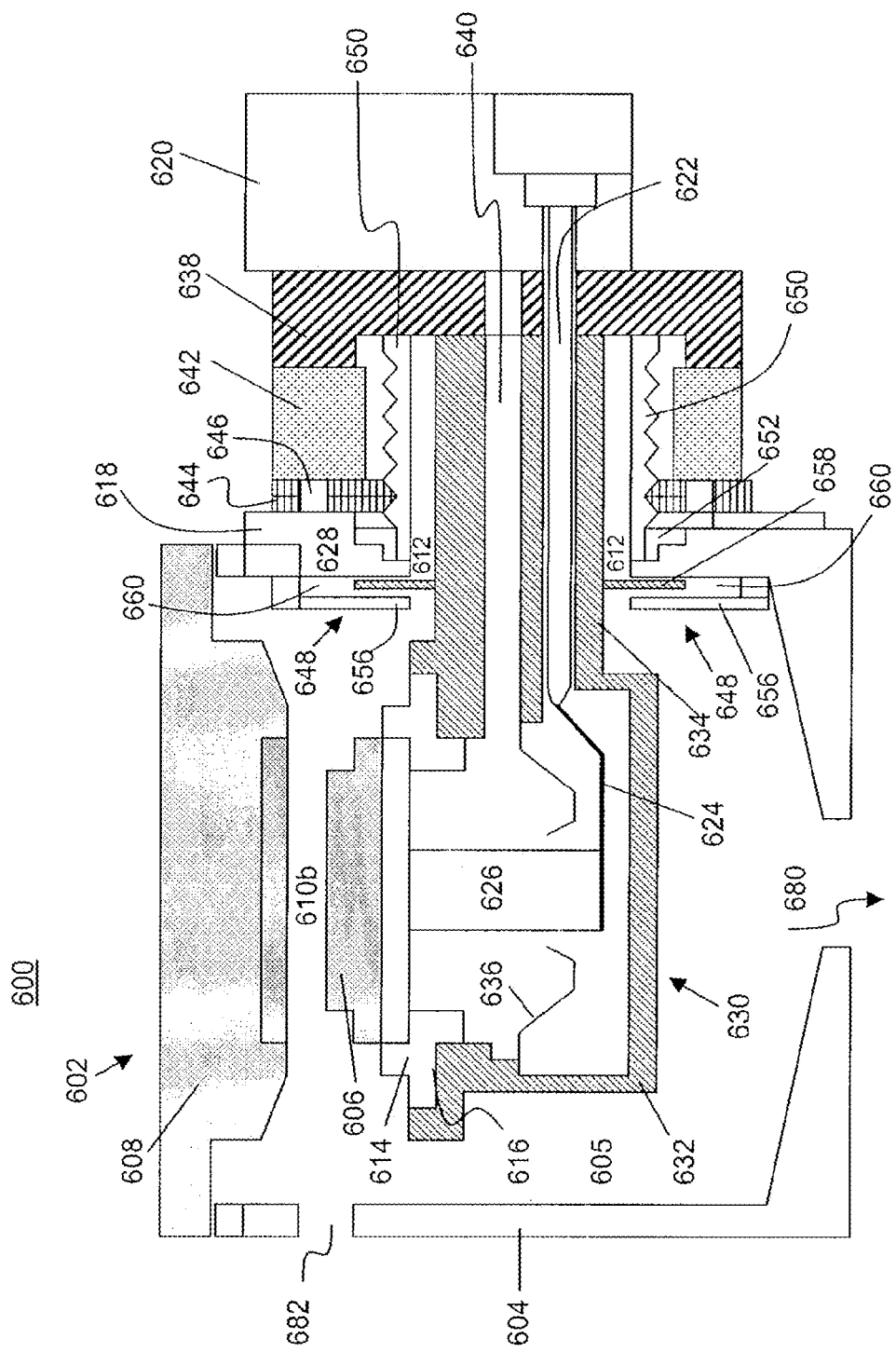
Figure 6C:
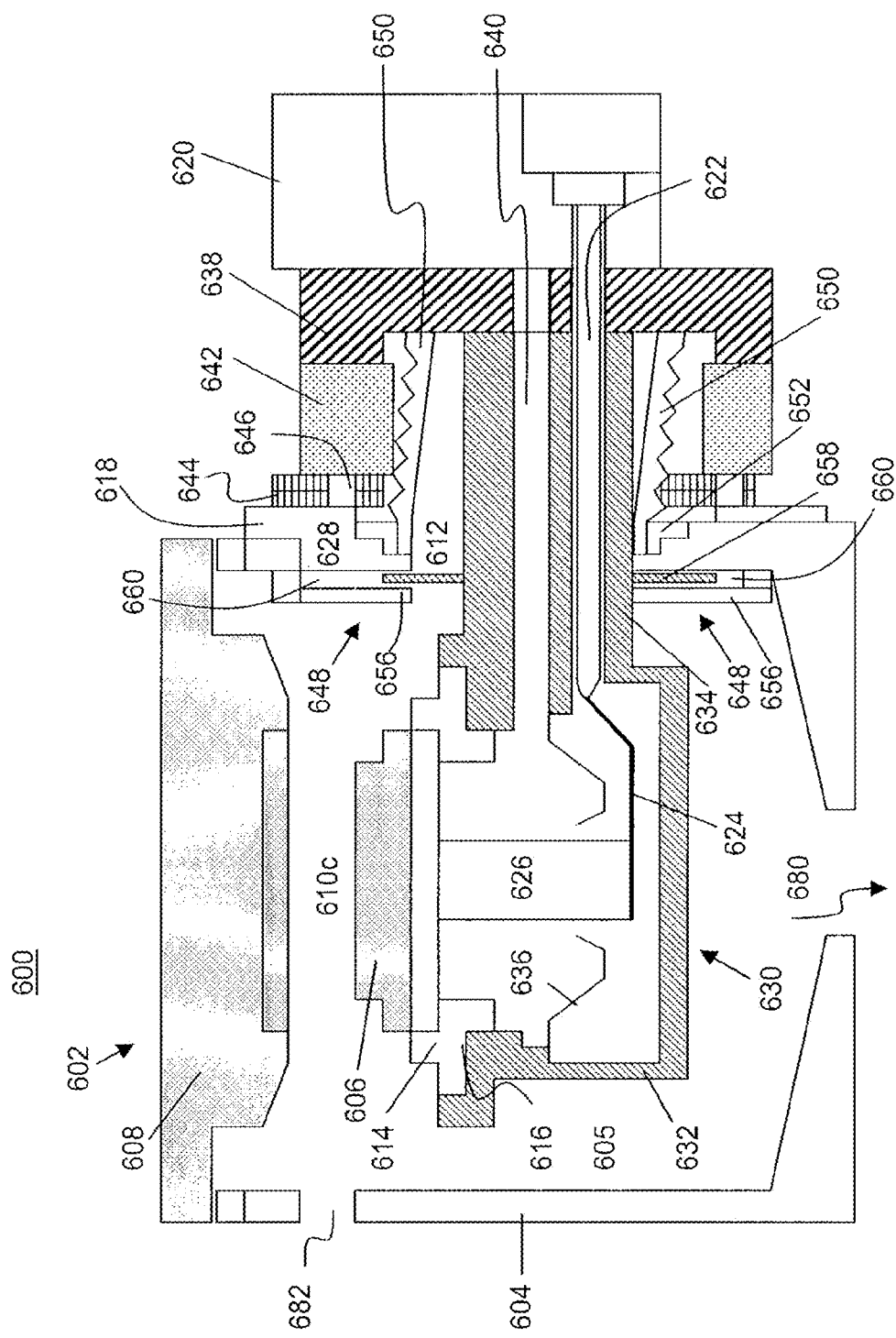

For instance, FIGS. 6A-6C illustrate an embodiment of an adjustable gap capacitively coupled confined RF plasma reactor 600. As depicted, a vacuum processing chamber 602 includes a chamber housing 604, surrounding an interior space housing a lower electrode 606. In an upper portion of the chamber 602 an upper electrode 608 is vertically spaced apart from the lower electrode 606. Planar surfaces of the upper and lower electrodes 608, 606 (configured to be used for plasma generation) are substantially parallel and orthogonal to the vertical direction between the electrodes. Preferably the upper and lower electrodes 608, 606 are circular and coaxial with respect to a vertical axis. A lower surface of the upper electrode 608 faces an upper surface of the lower electrode 606. The spaced apart facing electrode surfaces define an adjustable gap 610 there between. During plasma generation, the lower electrode 606 is supplied RF power by an RF power supply (match) 620. RF power is supplied to the lower electrode 606 though an RF supply conduit 622, an RF strap 624 and an RF power member 626. A grounding shield 636 may surround the RF power member 626 to provide a more uniform RF field to the lower electrode 606. As described in U.S. Pat. Pub. No. 2008/0171444 (which is hereby incorporated by reference in its entirety for all purposes), a wafer is inserted through wafer port 682 and supported in the gap 610 on the lower electrode 606 for processing, a process gas is supplied to the gap 610 and excited into plasma state by the RF power. The upper electrode 608 can be powered or grounded.

In the embodiment shown in FIGS. 6A-6C, the lower electrode 606 is supported on a lower electrode support plate 616. An insulator ring 614 interposed between the lower electrode 606 and the lower electrode support plate 616 insulates the lower electrode 606 from the support plate 616. An RF bias housing 630 supports the lower electrode 606 on an RF bias housing bowl 632. The bowl 632 is connected through an opening in a chamber wall plate 618 to a conduit support plate 638 by an arm 634 of the RF bias housing 630. In a preferred embodiment, the RF bias housing bowl 632 and RF bias housing arm 634 are integrally formed as one component, however, the arm 634 and bowl 632 can also be two separate components bolted or joined together.

The RF bias housing arm 634 includes one or more hollow passages for passing RF power and facilities, such as gas coolant, liquid coolant, RF energy, cables for lift pin control, electrical monitoring and actuating signals from outside the vacuum chamber 602 to inside the vacuum chamber 602 at a space on the backside of the lower electrode 606. The RF supply conduit 622 is insulated from the RF bias housing arm 634, the RF bias housing arm 634 providing a return path for RF power to the RF power supply

620. A facilities conduit 640 provides a passageway for facility components. Further details of the facility components are described in U.S. Pat. No. 5,948,704 and U.S. Pat. Pub. No. 2008/0171444 (both of which are hereby incorporated by reference in their entirety for all purposes) and are not shown here for simplicity of description. The gap 610 is preferably surrounded by a confinement ring assembly (not shown), details of which can be found in U.S. Pat. Pub. No. 2007/0284045 (which is hereby incorporated by reference in its entirety for all purposes).

The conduit support plate 638 is attached to an actuation mechanism 642. Details of an actuation mechanism are described in U.S. Pat. Pub. No. 2008/0171444 (which is hereby incorporated by reference in its entirety for all purposes). The actuation mechanism 642, such as a servo mechanical motor, stepper motor or the like is attached to a vertical linear bearing 644, for example, by a screw gear 646 such as a ball screw and motor for rotating the ball screw. During operation to adjust the size of the gap 610, the actuation mechanism 642 travels along the vertical linear bearing 644. FIG. 6A illustrates the arrangement when the actuation mechanism 642 is at a high position on the linear bearing 644 resulting in a small gap 610*a*. FIG. 6B illustrates the arrangement when the actuation mechanism 642 is at a mid position on the linear bearing 644. As shown, the lower electrode 606, the RF bias housing 630, the conduit support plate 638, the RF power supply 620 have all moved lower with respect to the chamber housing 604 and the upper electrode 608, resulting in a medium size gap 610*b*.

FIG. 6C illustrates a large gap 610*c* when the actuation mechanism 642 is at a low position on the linear bearing. Preferably, the upper and lower electrodes 608, 606 remain coaxial during the gap adjustment and the facing surfaces of the upper and lower electrodes across the gap remain parallel.

This embodiment allows the gap 610 between the lower and upper electrodes 606, 608 in the CCP chamber 602 during multi-step etch processes to be adjusted, for example, in order to maintain uniform etch across a large diameter substrate such as 300 mm wafers or flat panel displays. In particular, this embodiment pertains to a mechanical arrangement to facilitate the linear motion necessary to provide the adjustable gap between lower and upper electrodes 606, 608.

FIG. 6A illustrates laterally deflected bellows 650 sealed at a proximate end to the conduit support plate 638 and at a distal end to a stepped flange 628 of chamber wall plate 618. The inner diameter of the stepped flange defines an opening 612 in the chamber wall plate 618 through which the RF bias housing arm 634 passes. The laterally deflected bellows 650 provides a vacuum seal while allowing vertical movement of the RF bias housing 630, conduit support plate 638 and actuation mechanism 642. The RF bias housing 630, conduit support plate 638 and actuation mechanism 642 can be referred to as a cantilever assembly. Preferably, the RF power supply 620 moves with the cantilever assembly and can be attached to the conduit support plate 638. FIG. 6B shows the bellows 650 in a neutral position when the cantilever assembly is at a mid position. FIG. 6C shows the bellows 650 laterally deflected when the cantilever assembly is at a low position.

A labyrinth seal 648 provides a particle barrier between the bellows 650 and the interior of the plasma processing chamber housing 604. A fixed shield 656 is immovably attached to the inside inner wall of the chamber housing 604 at the chamber wall plate 618 so as to provide a labyrinth groove 660 (slot) in which a movable shield plate 658 moves vertically to accommodate vertical movement of the cantilever assembly. The outer portion of the movable shield plate 658 remains in the slot at all vertical positions of the lower electrode 606.

In the embodiment shown, the labyrinth seal 648 includes a fixed shield 656 attached to an inner surface of the chamber wall plate 618 at a periphery of the opening 612 in the chamber wall plate 618 defining a labyrinth groove 660. The movable shield plate 658 is attached and extends radially from the RF bias housing arm 634 where the arm 634 passes through the opening 612 in the chamber wall plate 618. The movable shield plate 658 extends into the labyrinth groove 660 while spaced apart from the fixed shield 656 by a first gap and spaced apart from the interior surface of the chamber wall plate 618 by a second gap allowing the cantilevered assembly to move vertically. The labyrinth seal 648 blocks migration of particles spalled from the bellows 650 from entering the vacuum chamber interior and blocks radicals from process gas plasma from migrating to the bellows 650 where the radicals can form deposits which are subsequently spalled.

FIG. 6A shows the movable shield plate 658 at a higher position in the labyrinth groove 660 above the RF bias housing arm 634 when the cantilevered assembly is in a high position (small gap 610*a*). FIG. 6C shows the movable shield plate 658 at a lower position in the labyrinth groove 660 above the RF bias housing arm 634 when the cantilevered assembly is in a low position (large gap 610*c*). FIG. 6B shows the movable shield plate 658 in a neutral or mid position within the labyrinth groove 660 when the cantilevered assembly is in a mid position (medium gap 610*b*). While the labyrinth seal 648 is shown as symmetrical about the RF bias housing arm 634, in other embodiments the labyrinth seal 648 may be asymmetrical about the RF bias arm 634.

Inductively Coupled Plasma Reactors for Use in ALE Operations

Inductively coupled plasma (ICP) reactors which, in certain embodiments, may be suitable for atomic layer etching (ALE) operations employing a chlorine plasma for adsorption and a helium-neon (helium-neon) plasma for desorption wherein VUV emission may be adjusted and/or controlled are now described. Such ICP reactors have also described in US Pat. Pub. No. 2014/0170853, filed Dec. 10, 2013, and titled "IMAGE REVERSAL WITH AHM GAP FILL FOR MULTIPLE PATTERNING," hereby incorporated by reference in its entirety and for all purposes.

Figure 7:
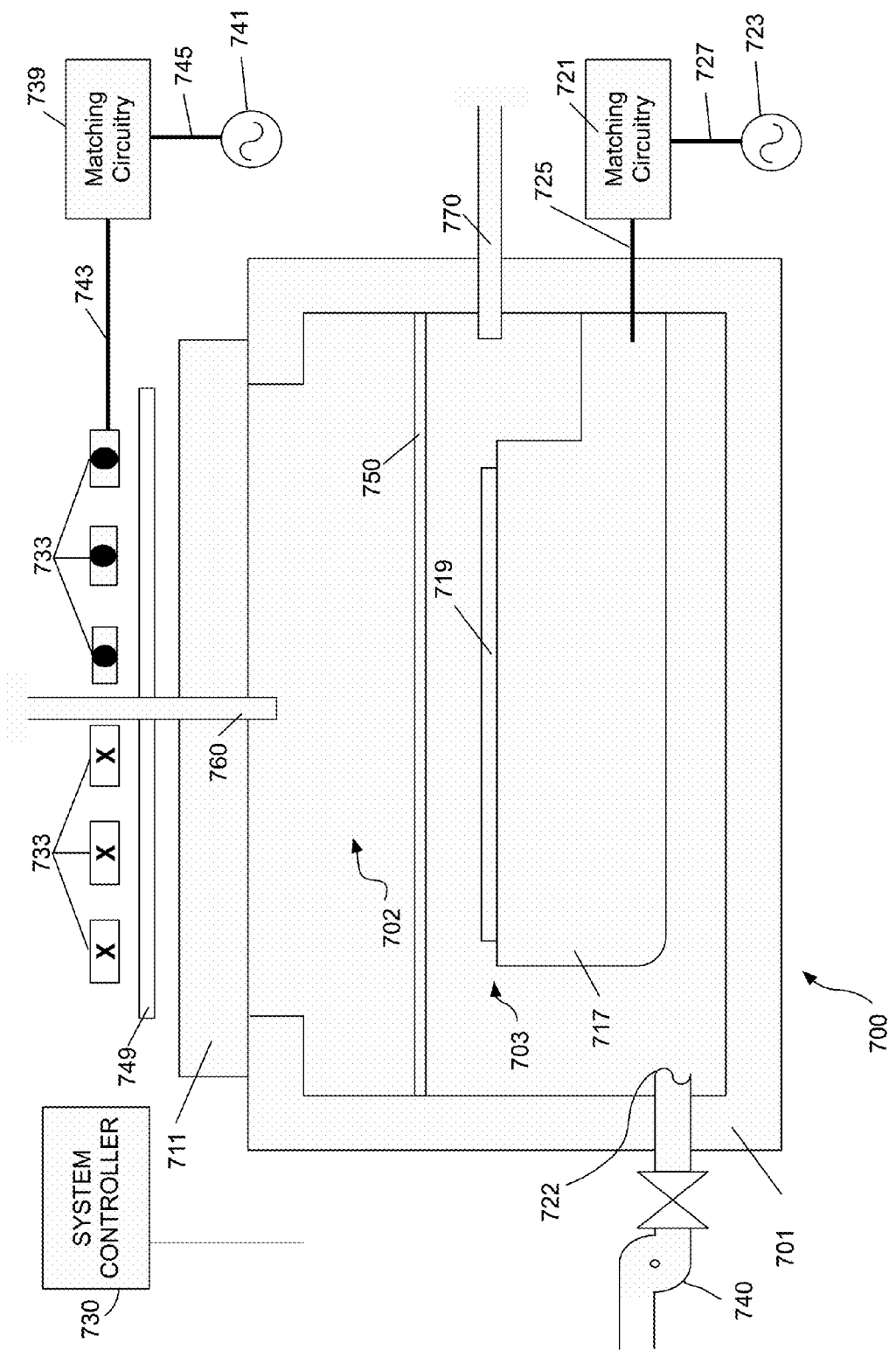
FIG. 7 is a schematic of an inductively coupled plasma (ICP) reactor appropriate for implementing various ALE processes described herein.

For instance, FIG. 7 schematically shows a cross-sectional view of an inductively coupled plasma etching apparatus 700 appropriate for implementing certain embodiments herein, an example of which is a Kiyo™ reactor, produced by Lam Research Corp. of Fremont, Calif. The inductively coupled plasma etching apparatus 700 includes an overall etching chamber structurally defined by chamber walls 701 and a window 711. The chamber walls 701 may be fabricated from stainless steel or aluminum. The window 711 may be fabricated from quartz or other dielectric material. An optional internal plasma grid 750 divides the overall etching chamber into an upper sub-chamber 702 and a lower sub-chamber 703. In most embodiments, plasma grid 750 may be removed, thereby utilizing a chamber space made of sub-chambers 702 and 703. A chuck 717 is positioned within the lower sub-chamber 703 near the bottom inner surface. The chuck 717 is configured to receive and hold a semiconductor wafer 719 upon which the etching process is performed. The chuck 717 can be an electrostatic chuck for supporting the wafer 719 when present. In some embodiments, an edge ring (not shown) surrounds chuck 717, and has an upper surface that is approximately planar with a top surface of a wafer 719, when present over chuck 717. The chuck 717 also includes electrostatic electrodes for chucking and dechucking the wafer. A filter and DC clamp power supply (not shown) may be provided for this purpose. Other control systems for lifting the wafer 719 off the chuck 717 can also be provided. The chuck 717 can be electrically charged using an RF power supply 723. The RF power supply 723 is connected to matching circuitry 721 through a connection 727. The matching circuitry 721 is connected to the chuck 717 through a connection 725. In this manner, the RF power supply 723 is connected to the chuck 717.

Elements for plasma generation include a coil 733 is positioned above window 711. The coil 733 is fabricated from an electrically conductive material and includes at least one complete turn. The example of a coil 733 shown in FIG. 7 includes three turns. The cross-sections of coil 733 are shown with symbols, and coils having an "X" extend rotationally into the page, while coils having a "●" extend rotationally out of the page. Elements for plasma generation also include an RF power supply 741 configured to supply RF power to the coil 733. In general, the RF power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned between the coil 733 and the window 711. The Faraday shield 749 is maintained in a spaced apart relationship relative to the coil 733. The Faraday shield 749 is disposed immediately above the window 711. The coil 733, the Faraday shield 749, and the window 711 are each configured to be substantially parallel to one another. The Faraday shield may prevent metal or other species from depositing on the dielectric window of the plasma chamber.

Process gases (e.g. helium, neon, etchant, etc.) may be flowed into the processing chamber through one or more main gas flow inlets 760 positioned in the upper chamber and/or through one or more side gas flow inlets 770. Likewise, though not explicitly shown, similar gas flow inlets may be used to supply process gases to the capacitively coupled plasma processing chamber shown in FIGS. 6A-6C. A vacuum pump, e.g., a one or two stage mechanical dry pump and/or turbomolecular pump 740, may be used to draw process gases out of the process chamber 724 and to maintain a pressure within the process chamber 700. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber in FIGS. 6A-6C may also be employed.

During operation of the apparatus, one or more process gases may be supplied through the gas flow inlets 760 and/or 770. In certain embodiments, process gas may be supplied only through the main gas flow inlet 760, or only through the side gas flow inlet 770. In some cases, the gas flow inlets shown in the figure may be replaced more complex gas flow inlets, one or more showerheads, for example. The Faraday shield 749 and/or optional grid 750 may include internal channels and holes that allow delivery of process gases to the chamber. Either or both of Faraday shield 749 and optional grid 750 may serve as a showerhead for delivery of process gases.

Radio frequency power is supplied from the RF power supply 741 to the coil 733 to cause an RF current to flow through the coil 733. The RF current flowing through the coil 733 generates an electromagnetic field about the coil 733. The electromagnetic field generates an inductive current within the upper sub-chamber 702. The physical and chemical interactions of various generated ions and radicals with the wafer 719 selectively etch features of the wafer.

If the plasma grid is used such that there is both an upper sub-chamber 702 and a lower sub-chamber 703, the inductive current acts on the gas present in the upper sub-chamber 702 to generate an electron-ion plasma in the upper sub-chamber 702. The optional internal plasma grid 750 limits the amount of hot electrons in the lower sub-chamber 703. In some embodiments, the apparatus is designed and operated such that the plasma present in the lower sub-chamber 703 is an ion-ion plasma.

Both the upper electron-ion plasma and the lower ion-ion plasma may contain positive and negative ions, through the ion-ion plasma will have a greater ratio of negative ions to positive ions. Volatile etching byproducts may be removed from the lower-subchamber 703 through port 722.

The chuck 717 disclosed herein may operate at elevated temperatures ranging between about 10° C. and about 250° C. The temperature will depend on the etching process operation and specific recipe. In some embodiments, the chamber 701 may also operate at pressures in the range of between about 1 mTorr and about 95 mTorr. In certain embodiments, the pressure may be higher as disclosed above.

Chamber 701 may be coupled to facilities (not shown) when installed in a clean room or a fabrication facility. Facilities include plumbing that provide processing gases, vacuum, temperature control, and environmental particle control. These facilities are coupled to chamber 701, when installed in the target fabrication facility. Additionally, chamber 701 may be coupled to a transfer chamber that allows robotics to transfer semiconductor wafers into and out of chamber 701 using typical automation.

In some embodiments, a system controller 730 (which may include one or more physical or logical controllers) controls some or all of the operations of an etching chamber. The system controller 730 may include one or more memory devices and one or more processors.

Cluster Tool Having an Integrated Metrology Tool

Figure 8:
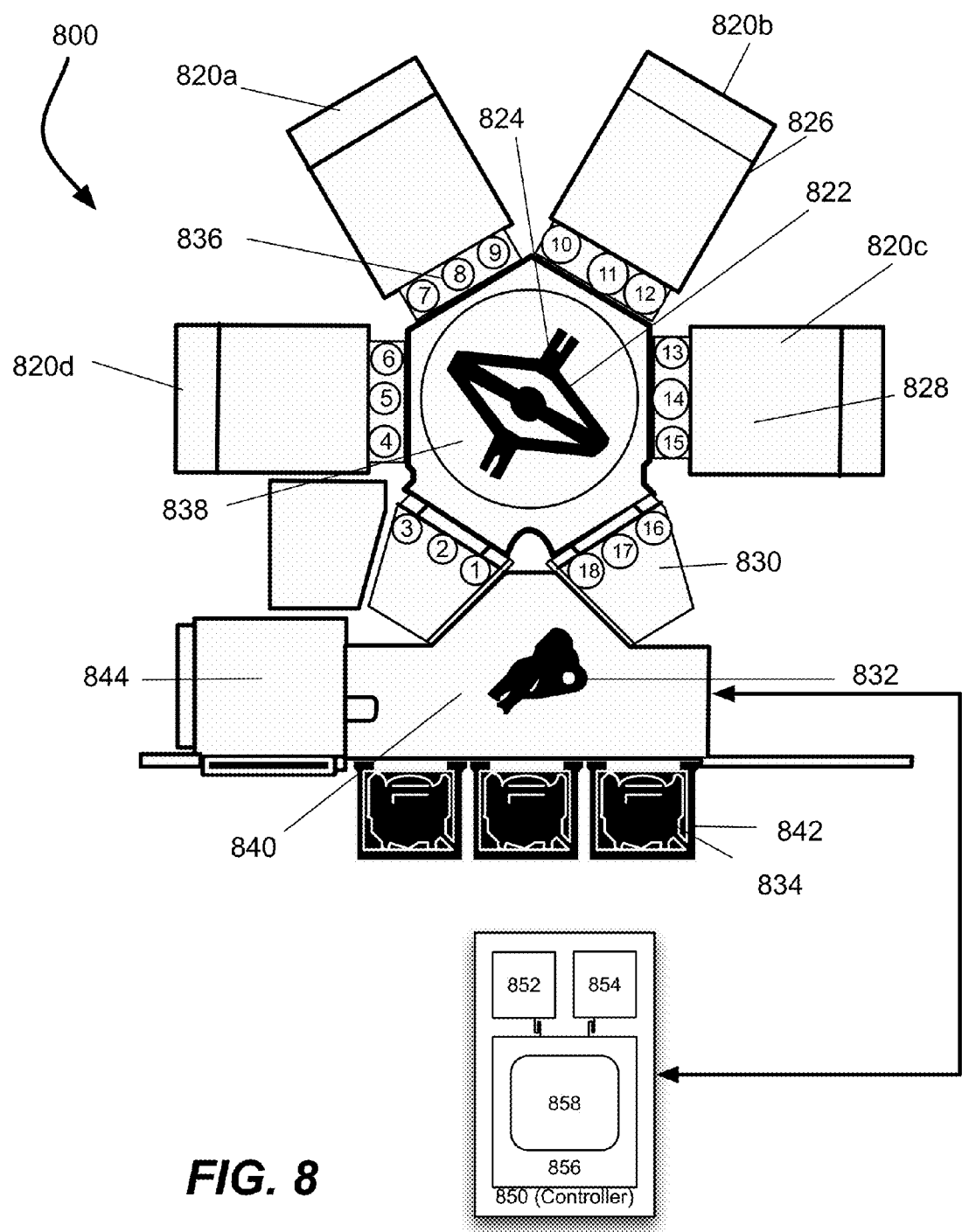
FIG. 8 is a schematic of a substrate processing cluster tool appropriate for implementing various ALE processes described herein.

FIG. 8 depicts a semiconductor process cluster tool 800 with various modules that interface with a vacuum transfer module 838 (VTM). The arrangement of transfer modules to "transfer" wafers among multiple storage facilities and processing modules may be referred to as a "cluster tool architecture" system. Airlock 830, also known as a loadlock or transfer module, is shown in VTM 838 with four processing modules 820a-820d, which may be individual optimized to perform various fabrication processes.

For example, processing modules 820a-820d may be implemented to perform substrate etching (such as etching of patterns in single and two-dimensions via an ALE process), deposition (such as deposition of conformal films via an atomic layer deposition (ALD) process), ion implantation, wafer cleaning, wafer planarization, sputtering, and/or other semiconductor processes. Thus, for example, a processing module may be an inductively coupled plasma reactor (as described above), or a capacitively coupled plasma reactor (as also described above).

In some embodiments, one or more of the substrate processing modules (any of 820a-820d) may be dedicated to acquiring wafer metrology data which may be used as a basis for adjusting and/or controlling the operation(s) of the other wafer processing modules on the cluster tool. For example, a wafer metrology tool module may measure one or more properties of one or more substrate features after an etch operation, and the resulting data may then be used to adjust process parameters—such as, for instance, the relative proportions of helium and neon in the plasma used to activate an ALE process—in further etch operations taking place on the cluster tool. In certain such embodiments, the substrate feature measured by the metrology module/tool may be an etch profile of a feature of a semiconductor substrate.

In some etch operations performed on a cluster tool like the one shown in FIG. 8, measurements may be made during an etch operation, and the measurement may be analyzed in order to determine how to adjust and/or control one or more process parameters while the same etch is in progress and/or in a subsequent etch operation (e.g., on a different substrate). For instance, an inductively coupled plasma reactor or a capacitively coupled plasma reactor may employ an optical detector for measuring an emission intensity from one or more visible, infrared, ultraviolet (UV), and/or vacuum ultraviolet (VUV) emission bands, for example, from the plasma used to activate the ALE surface reaction. In some embodiments, the measured emission intensity may be analyzed and used to adjust the relative concentrations of helium and neon in the helium-neon plasma used in the ALE operation as described herein.

Referring again to FIG. 8, airlock 830 and process module 820 may be referred to as "stations." Each station has a facet 836 that interfaces the station to VTM 838. Inside each facet, sensors 1-18 are used to detect the passing of wafer 826 when moved between respective stations. Robot 822 transfers wafer 826 between stations. In one embodiment, robot 822 has one arm, and in another embodiment, robot 822 has two arms, where each arm has an end effector 824 to pick wafers such as wafer 826 for transport. Front-end robot 832, in atmospheric transfer module (ATM) 840, is used to transfer wafers 826 from cassette or Front Opening Unified Pod (FOUP) 834 in Load Port Module (LPM) 842 to airlock 830. Module center 828 inside process module 820 is one location for placing wafer 826. Aligner 844 in ATM 840 is used to align wafers.

In one example of a processing sequence, a wafer is placed in one of the FOUPs 834 in the LPM 842. Front-end robot 832 transfers the wafer from the FOUP 834 to an aligner 844, which allows the wafer 826 to be properly centered before it is etched or processed. After being aligned, the wafer 826 is moved by the front-end robot 832 into an airlock 830. Because airlock modules have the ability to match the environment between an ATM and a VTM, the wafer 826 is able to move between the two pressure environments without being damaged. From the airlock module 830, the wafer 826 is moved by robot 822 through VTM 838 and into one of the process modules 820a-820d. In order to achieve this wafer movement, the robot 822 uses end effectors 824 on each of its arms. Once the wafer 826 has been processed, it is moved by robot 822 from the process modules 820a-820d to an airlock module 830. From here, the wafer 826 may be moved by the front-end robot 832 to one of the FOUPs 834 or to the aligner 844.

It should be noted that a system controller (as described below) may be used to control the operation of the cluster tool (e.g., to control substrate movement amongst the various stations on the cluster tool). The system controller may be local to the cluster architecture, or it may be located external to the cluster tool in the manufacturing floor, or in a remote location and connected to the cluster tool via a network.

System Controllers

FIG. 8 also depicts an embodiment of a system controller 850 employed to control process conditions and hardware states of process tool 800 and its process stations. System controller 850 may include one or more memory devices 856, one or more mass storage devices 854, and one or more processors 852. Processor 852 may include one or more CPUs, ASICs, general-purpose computer(s) and/or specific purpose computer(s), one or more analog and/or digital input/output connection(s), one or more stepper motor controller board(s), etc.

In some embodiments, system controller 850 controls some or all of the operations of process tool 800 including the operations of its individual process stations. System controller 850 may execute machine-readable system control instructions 858 on processor 852—the system control instructions 858, in some embodiments, loaded into memory device 856 from mass storage device 854. System control instructions 858 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 800. These processes may include various types of processes including, but not limited to, processes related to the etching of film on substrates such as by ALE, operations involving plasma-activation of adsorbed surface reactants such as by the use of a helium-neon plasma, the adjustment of plasma VUV emission such as from helium via use of a collisional energy adsorber gas such as neon, as well as other types of substrate processing operations.

Thus, for example, with respect to an apparatus for performing ALE processes having an optical detector for measuring an emission intensity from the plasma used to activate the surface etch reaction, the machine-readable instructions 858 executed by system controller 850 may include instructions for:

operating a plasma generator to generate a plasma in a processing chamber, the plasma comprising helium and neon, the plasma emitting VUV radiation; and operating one or more gas flow inlets to adjust the emission of VUV radiation from the plasma by flowing helium and/or neon into the processing chamber in a proportion so as to alter the concentration ratio of helium to neon in the plasma.

and also, for example and depending on the embodiment, instructions for:

operating an optical detector to measure an emission intensity of an emission band of the plasma; and operating one or more gas flow inlets to set the flow rate of helium and/or neon into the processing chamber in response to the measured emission intensity.

Likewise, with respect to an apparatus for performing ALE processes having a metrology tool for measuring etch profile, the machine readable instructions of the controller may include instructions for:

operating one or more gas flow inlets to flow etchant gas into a processing chamber;

setting conditions within the processing chamber such that the etchant adsorbs onto the surface of a semiconductor substrate held therein to form an adsorption-limited layer of etchant;

operating a valve-controlled conduit and vacuum pump to remove unadsorbed and/or desorbed etchant from the volume surrounding the adsorbed etchant;

operating a plasma generator, after absorption of etchant and removal of unadsorbed and/or desorbed etchant, to etch a feature on the semiconductor substrate;

operating a metrology tool to measure an etch profile of the etched feature on the semiconductor substrate; and operating the one or more gas flow inlets to set the flow rate of helium and/or neon into the processing chamber in response to the measured etch profile.

System control instructions 858 may be configured in any suitable way. For example, various process tool component subroutines or control objects may be written to control operation of the process tool components necessary to carry out various process tool processes. System control instructions 858 may be coded in any suitable computer readable programming language. In some embodiments, system control instructions 858 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 858 may include input/output control (IOC) sequencing instructions for controlling the various parameters described above. For example, each phase of a deposition and/or etch process or processes may include one or more instructions for execution by system controller 850. The instructions for setting process conditions for a film deposition and/or etch process phase, for example, may be included in a corresponding deposition and/or etch recipe phase. In some embodiments, the recipe phases may be sequentially arranged, so that all instructions for a process phase are executed concurrently with that process phase.

Other computer-readable instructions and/or programs stored on mass storage device 854 and/or memory device 856 associated with system controller 850 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal (see 508, FIG. 5) and to control the spacing between the substrate and other parts of process tool 500 of FIG. 5. The positioning program may include instructions for appropriately moving substrates in and out of the reaction chamber as necessary to deposit and/or etch film on the substrates.

A process gas control program may include instructions for controlling gas composition and flow rates and optionally for flowing gas into the volumes surrounding one or more process stations prior to deposition and/or etch in order to stabilize the pressure in these volumes. In some embodiments, the process gas control program may include instructions for introducing certain gases into the volume(s) surrounding the one or more process stations within a processing chamber during film deposition and/or etching operations on substrates. The process gas control program may also include instructions to deliver these gases at the same rates, for the same durations, or at different rates and/or for different durations depending on the composition of the film being deposited and/or the nature of the etching process involved. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates and/or etching of the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates and/or etching of the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on and/or etching of the substrates.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas compositions and flow rates, temperatures (e.g., substrate holder and showerhead temperatures), pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 850 from various process tool sensors. The signals for controlling the processes may be output on the analog and/or digital output connections of process tool 800. Non-limiting examples of process tool sensors that may be monitored include mass flow controllers (MFCs), pressure sensors (such as manometers), temperature sensors such as thermocouples, etc. Appropriately programmed feedback and control algorithms may be used with data from these sensors to maintain process conditions.

System controller 850 may provide machine-readable instructions for implementing the above-described deposition and/or etch processes. The instructions may control a variety of process parameters, such as DC power level, RF bias power level, pressure, temperature, etc. The instructions may control the parameters to perform film deposition and/or etch operations as described herein.

Thus, the system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate processing operations disclosed herein may be coupled to the system controller.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module (employing inductively or capacitively coupled plasmas), a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Lithographic Patterning

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

OTHER EMBODIMENTS

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing the foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

The invention claimed is:

1. A method of adjusting the emission of vacuum ultraviolet (VUV) radiation from a plasma in a semiconductor processing chamber, the method comprising:
   generating a plasma in the processing chamber, the plasma comprising a VUV-emitter gas comprising He and a collisional energy absorber gas comprising Ne, the plasma emitting VUV radiation; and
   adjusting the emission of VUV radiation from the plasma by altering the concentration ratio of the VUV-emitter gas to collisional energy absorber gas in the plasma.

2. The method of claim 1, wherein the VUV-emitter gas is helium.

3. The method of claim 2, wherein the collisional energy absorber gas is neon.

4. The method of claim 3, wherein adjusting the emission of VUV radiation from the plasma comprises flowing helium and/or neon into the processing chamber in a proportion so as to alter the concentration ratio of helium to neon in the plasma.

5. The method of claim 4, wherein the emission of VUV radiation from the plasma is adjusted upward by flowing helium into the processing chamber so as to increase the ratio of helium to neon in the plasma.

6. The method of claim 4, wherein the emission of VUV radiation from the plasma is adjusted downward by flowing neon into the processing chamber so as to decrease the ratio of helium to neon in the plasma.

7. The method of claim 4, further comprising:
   measuring a property of the plasma and/or the substrate; and
   setting the flow of helium and/or neon into the processing chamber in response to the measured property.

8. The method of claim 7, wherein the property is the emission intensity from an emission band of an excited state species of the plasma.

9. The method of claim 8, wherein the measured emission band is the emission band of neon centered at 632.8 nm.

10. The method of claim 7, wherein the property is the profile of an etched feature of a semiconductor substrate measured with a metrology tool, the feature having been etched in the processing chamber.

11. The method of claim 10, wherein the flow of helium is decreased and/or the flow of neon is increased in response to a measured bowing of the sidewalls of the etched feature.

12. The method of claim 3, wherein the plasma is a capacitively-coupled plasma.

13. The method of claim 12, wherein the semiconductor processing chamber in which the plasma is generated is part of a capacitively coupled plasma reactor, the reactor having an upper plate, the reactor configured such that the gap between the upper plate and the substrate is between about 1.5 cm and 2.5 cm.

14. The method of claim 3, wherein the plasma is an inductively-coupled plasma, wherein the semiconductor processing chamber in which the plasma is generated is part of an inductively coupled plasma reactor having a gap region within which the plasma is generated, and wherein the reactor comprises one or more components located within the gap region which provide a structure against which neon atoms may collide and be collisionally de-excited.

15. The method of claim 14, wherein the one or more components which provide said structure for the de-excitation of neon comprise a set of concentric cylinders oriented with their central axes perpendicular to the plane of the substrate.

16. A method of etching a feature on the surface of a semiconductor substrate, the method comprising:
   (a) adsorbing an etchant onto the surface of a semiconductor substrate such that the etchant forms an adsorption-limited layer on the surface;
   (b) after (a), removing unadsorbed and/or desorbed etchant from the volume surrounding the adsorbed etchant;
   (c) after (b), generating a plasma in the processing chamber, the plasma comprising helium and neon, the plasma emitting VUV radiation;
   (d) contacting the adsorbed etchant with the plasma to etch the surface of the substrate; and
   (e) repeating (a)-(d) multiple times and adjusting the emission of VUV radiation from the plasma in (d) by altering the concentration ratio of helium to neon in the plasma, thereby altering the anisotropy of the etching of the surface of the substrate.

17. The method of claim 16, wherein the etchant comprises chlorine.

18. The method of claim 16, wherein adjusting the emission of VUV radiation from the plasma comprises flowing helium and/or neon into the processing chamber in a proportion so as to alter the concentration ratio of helium to neon in the plasma.

19. The method of claim 18, further comprising:
   measuring the profile of the etched feature of the semiconductor substrate with a metrology tool; and
   setting the flow of helium and/or neon into the processing chamber in response to the measured profile.

* * * * *